(12) United States Patent
Ikeda

(10) Patent No.: US 7,528,540 B2
(45) Date of Patent: May 5, 2009

(54) LIGHT EMITTING DEVICE AND OPTICAL DEVICE USING THE SAME

(75) Inventor: Masao Ikeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/242,768

(22) Filed: Oct. 4, 2005

(65) Prior Publication Data

US 2006/0076566 A1    Apr. 13, 2006

Related U.S. Application Data

(63) Continuation of application No. 10/725,918, filed on Dec. 1, 2003, now Pat. No. 6,956,322, which is a continuation of application No. 09/783,914, filed on Feb. 15, 2001, now Pat. No. 7,119,487.

(30) Foreign Application Priority Data

Feb. 15, 2000   (JP) .......................... P2000-041361

(51) Int. Cl.
  *H01J 1/62* (2006.01)
(52) U.S. Cl. ........................ 313/498; 257/10
(58) Field of Classification Search ......... 313/498–512; 372/50; 257/10
  See application file for complete search history.

(56) References Cited

U.S. PATENT DOCUMENTS

| 3,704,376 | A |   | 11/1972 | Lehovec et al. |         |
|-----------|---|---|---------|----------------|---------|
| 3,753,808 | A | * | 8/1973  | Ono et al.     | 438/37  |
| 3,864,592 | A | * | 2/1975  | Pankove        | 313/503 |
| 5,140,385 | A | * | 8/1992  | Kukimoto et al.| 257/94  |
| 5,965,907 | A |   | 10/1999 | Huang et al.   |         |
| 6,136,623 | A | * | 10/2000 | Hofstetter et al. | 438/28 |
| 6,297,559 | B1 | * | 10/2001 | Call et al.   | 257/778 |
| 6,358,764 | B1 |   | 3/2002  | Nemoto         |         |
| 7,030,552 | B2 | * | 4/2006 | Chao et al.    | 313/504 |
| 7,038,236 | B2 | * | 5/2006 | Park et al.    | 257/40  |

FOREIGN PATENT DOCUMENTS

| JP | 11220218    |   | 10/1995 |
|----|-------------|---|---------|
| JP | 8-78722     |   | 3/1996  |
| JP | 11-145562   |   | 5/1999  |
| JP | 11-186651   |   | 7/1999  |
| JP | 11340587    |   | 10/1999 |
| JP | P2000-22266 | * | 1/2000  |
| JP | 11112091    | * | 11/2006 |

* cited by examiner

*Primary Examiner*—Joseph L Williams
(74) *Attorney, Agent, or Firm*—Sonnenschein Nath & Rosenthal LLP

(57) ABSTRACT

A light emitting device which can be easily manufactured and can control the positions of light emission precisely, and an optical device. A first and second light emitting elements are formed on one face of a supporting base. The first light emitting element has an active layer made of GaInN mixed crystal on a GaN-made first substrate on the side thereof on which the supporting base is disposed. The second light emitting element has lasing portions on a GaAs-made second substrate on the side thereof on which the supporting base is disposed. Since the first and second light emitting elements are not grown on the same substrate, a multiple-wavelength laser having the output wavelength of around 400 nm can be easily obtained. Since the first substrate is transparent in the visible region, the positions of light emitting regions in the first and second light emitting elements can be precisely controlled by lithography.

12 Claims, 16 Drawing Sheets

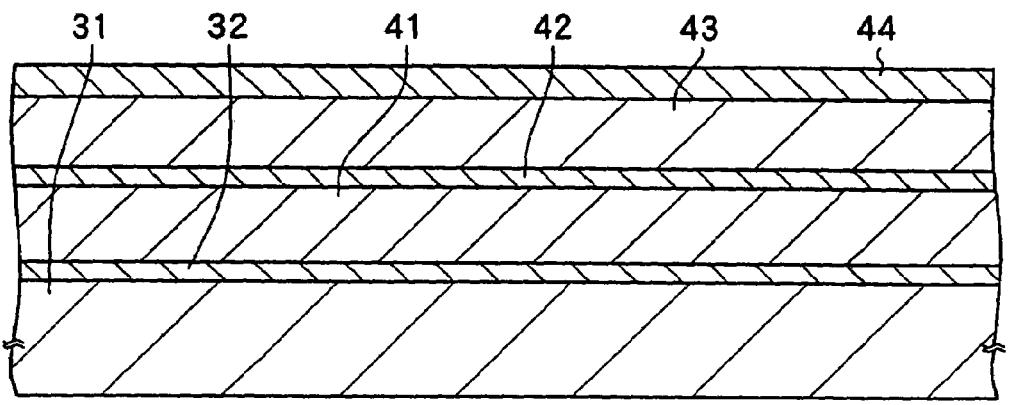
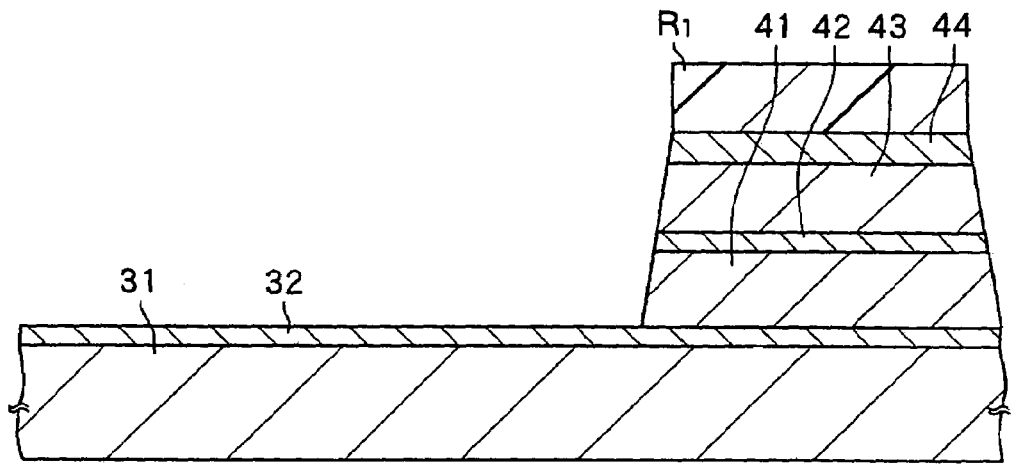

LIGHT EMITTING DEVICE AND OPTICAL DEVICE USING THE SAME

CROSS REFERENCE TO RELATED APPLICATIONS

This is a continuation of U.S. application Ser. No. 10/725,918, filed on Dec. 1, 2003, now U.S. Pat. No. 6,956,322, which is a continuation of U.S. application Ser. No. 09/783,914, filed on Feb. 15, 2001, now U.S. Pat. No. 7,119,487, and claims priority to Japanese Application No. P2000-041361 filed on Feb. 15, 2000, all of which are incorporated herein by reference to the extent permitted by law.

BACKGROUND OF THE INVENTION

1. Field of the Invention

The present invention relates to a light emitting device having a plurality of light emitting elements, and an optical device using the same.

2. Description of the Related Art

In recent years, in the field of light emitting devices, a semiconductor laser (LD; laser diode) in which a plurality of light emitting portions of different output wavelengths are formed on the same substrate (or board) (hereinafter referred to as a multiple-wavelength laser) is actively developed. An example of such a multiple-wavelength laser is, as shown in FIG. 1, obtained by forming a plurality of light emitting portions of different output wavelengths on a single chip (what is called a monolithic type multiple-wavelength laser). In the multiple-wavelength laser, for example, a lasing portion 201 formed by growing layers of semiconductor materials of the system AlGaAs by vapor phase epitaxy and a lasing portion 202 formed by growing layers of semiconductor materials of the system AlGaInP are disposed side by side on one face of a substrate 212 made of GaAs (gallium arsenide) with an isolation groove 211 between them. In this case, the output wavelength of the lasing portion 201 is in the range of the order of 700 nm (for example, 780 nm) and that of the lasing portion 202 is in the range of the order of 600 nm (for example, 650 nm).

Except for the structure shown in FIG. 1, a structure (what is called a hybrid type multiple-wavelength laser) in which a plurality of semiconductor lasers $LD_1$ and $LD_2$ having different output wavelengths are mounted side by side on a board 221 has been also proposed. The above-mentioned monolithic-type laser is, however, more effective in controlling the light emitting point intervals with high accuracy.

These multiple-wavelength lasers are used, for example, as laser light sources of optical disk drives. At present, in an optical disk drive, semiconductor laser light in the range of the order of 700 nm is generally used for optical playback of CD (Compact Disk) recording or for optical recording/playback using recordable optical disks such as CD-Rs (recordable CDs), CD-RWs (rewritable CDs) or MDs (Mini Disks). Semiconductor laser light in the range of the order of 600 nm is used for optical recording/playback using DVDs (Digital Versatile Disks). By mounting a multiple-wavelength laser as described above on an optical disk drive, optical recording/playback becomes possible with respect to any existing optical disks. Moreover, the lasing portions 201 and 202 are disposed side by side on the same substrate (as for the semiconductor lasers $LD_1$ and $LD_2$ of the hybrid type, on the same board), only one package is necessary for the laser light source. The number of parts of an optical system such as an objective lens and a beam splitter for optical recording/playback using various optical disks is decreased to simplify the configuration of the optical system. Thus, reduction in size and cost of an optical disk drive can be achieved.

Meanwhile, in recent years, the demand for further growth of optical recording area density by using semiconductor lasers of shorter output wavelengths has been growing. Heretofore known materials of semiconductor lasers addressing the demand are Group III-V compound semiconductors of the nitride system (hereinbelow, also called semiconductors of the system GaN) typified by GaN, AlGaN mixed crystals, and GaInN mixed crystals. Semiconductor lasers using semiconductors of the system GaN are capable of light emission at a wavelength of around 400 nm, which is regarded as the limit wavelength at which optical recording/playback is done using an optical disk and an existing optical system, and therefore, they receive much attention as light sources of next-generation optical recording/playback apparatuses. It is also expected as light sources of full-color displays using three primary colors of RGB. Thus, development of multiple-wavelength lasers with lasing portions of the system GaN is desired.

As an example of related-art multiple-wavelength lasers with lasing portions of the system GaN, as shown in FIG. 3, a multiple-wavelength laser is proposed in which the lasing portion 201 of the system AlGaAs, the lasing portion 202 of the system AlGaInP, and the lasing portion 203 of the system GaN are formed side by side on one face of a substrate 231 made of SiC (silicon carbide) with isolation grooves 211a and 211b between them (refer to Publication of Japanese Unexamined Patent Application No. Hei-11-186651).

In the case of fabricating the monolithic type multiple-wavelength laser, however, there is a problem such that it is difficult to integrate lasing portions on the same substrate as one chip due to, for example, a large difference in lattice constant between the materials of the system GaN and the materials of the system AlGaAs or AlGaInP.

The hybrid type multiple-wavelength laser has, as already described, a problem of poor controllability on the light emitting point intervals. The side-by-side arrangement of three or more semiconductor lasers causes an inconvenience such that the controllability on the light emitting point intervals further deteriorates.

SUMMARY OF THE INVENTION

The invention has been achieved in consideration of the problems and its object is to provide a light emitting device which can be easily manufactured and can control the position of light emission with accuracy, and an optical device using the light emitting device.

A light emitting device according to the invention has a plurality of light emitting devices stacked on one face of a supporting base.

Another light emitting device according to the invention has: a supporting base; a first light emitting element having a first substrate, provided on one face of the supporting base; and a second light emitting element having a second substrate, provided on the side of the first light emitting element opposite to the supporting base.

An optical device according to the invention has a light emitting device in which a plurality of light emitting elements are stacked on one face of a supporting base.

In another optical device according to the invention, a light emitting device is mounted. The light emitting device comprises: a supporting base; a first light emitting element having a first substrate, provided on one face of the supporting base; and a second light emitting element having a second substrate, provided on the side of the first light emitting element opposite to the supporting base.

In the light emitting device according to the invention and the other light emitting device according to the invention, a plurality of light emitting elements are stacked on one face of a supporting base. Therefore, the devices are easily manufactured and the light emitting regions are disposed with high precision.

In the optical device according to the invention and the other optical device according to the invention, they have the light emitting device according to the invention in which light emitting regions are disposed with high precision. This contributes to size reduction.

Other and further objects, features and advantages of the invention will appear more fully from the following description.

BRIEF DESCRIPTION OF THE DRAWINGS

FIGS. 7A and 7B are cross sections for explaining a manufacturing process subsequent to FIG. 6B.

DETAILED DESCRIPTION OF PREFERRED EMBODIMENTS

Embodiments of the invention will be described in detail hereinbelow with reference to the drawings.

First Embodiment

Figure 4:
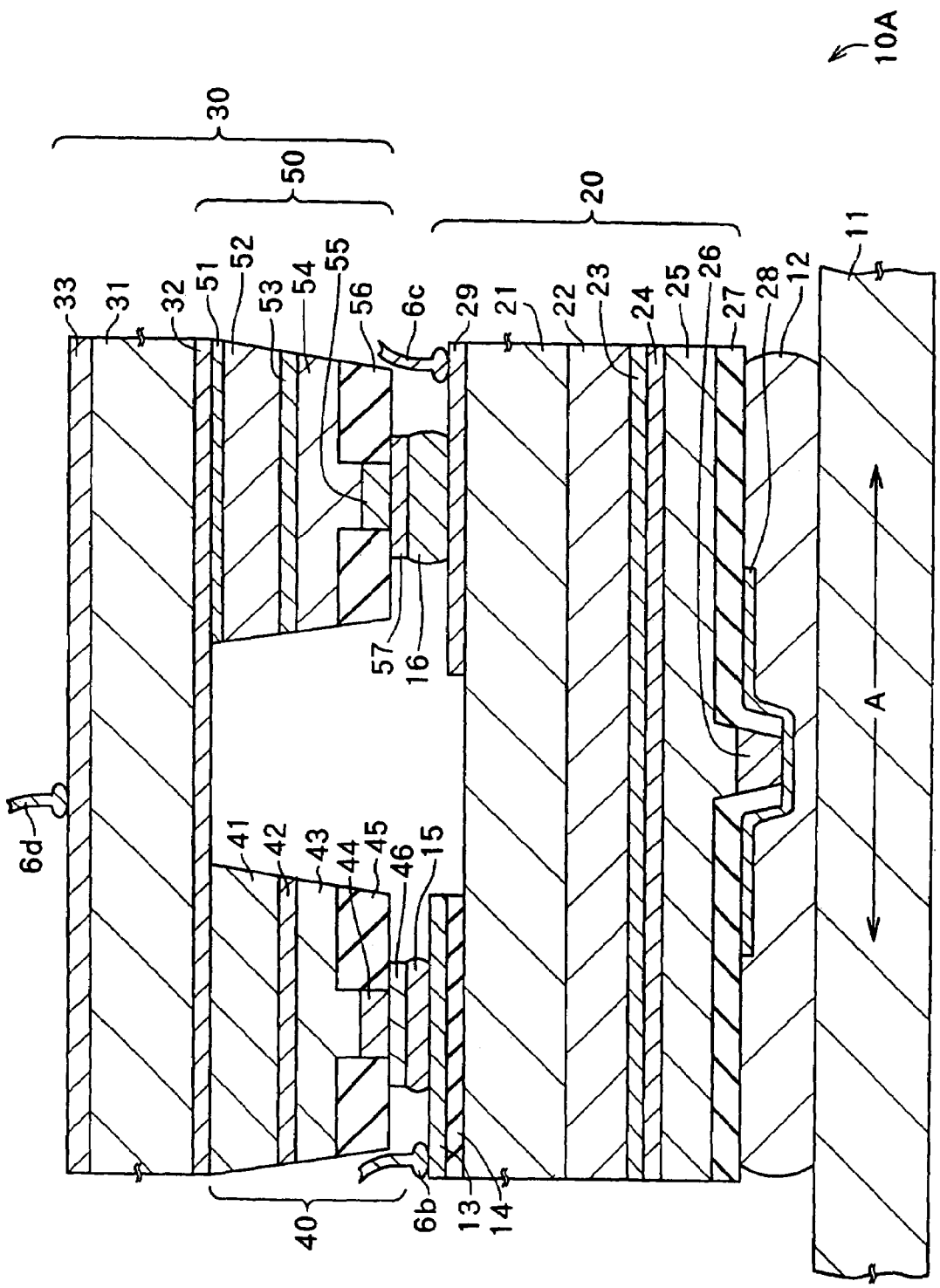
FIG. 4 is a cross section showing the configuration of a light emitting device according to a first embodiment of the invention.

FIG. 4 shows the sectional structure of a light emitting device 10A according to a first embodiment of the invention. The light emitting device 10A has a supporting base 11, a first light emitting element 20 disposed on one face of the supporting base 11, and a second light emitting element 30 disposed on the side of the first light emitting element 20 opposite to the supporting base 11.

The supporting base 11 is made of a metal such as copper (Cu) and serves as a heat sink for dissipating heat generated by the first and second light emitting elements 20 and 30. The supporting base 11 is electrically connected to an external power source (not shown) and also has the role of electrically connecting the first light emitting element 20 to the external power source.

The first light emitting element 20 is, for example, a semiconductor laser capable of emitting light having a wavelength of around 400 nm. The first light emitting element 20 has a configuration in which an n-type cladding layer 22, an active layer 23, a degradation preventing layer 24, a p-type cladding layer 25, and a p-side contact layer 26 which are made of a Group III-V compound semiconductor of the nitride system are laid one upon another in the order named on a first substrate 21 made of a Group III-V compound semiconductor of the nitride system, on the side thereof on which the supporting base 11 is disposed. The Group III-V compound semiconductor of the nitride system refers to a material containing at least one of Group 3B elements in the short-period type periodic table and at least nitrogen (N) from Group 5B elements in the short-period type periodic table.

Specifically, the first substrate 21 is made of, for example, n-type GaN doped with silicon (Si) as an n-type impurity, and its thickness in the deposition direction (hereinbelow, simply referred to as thickness) is, for example, 80 to 100 µm. GaN is a transparent material in the visible region (about 380 to 800 nm). GaN is a material having excellent thermal conductivity as high as about 1.3 W/(cm$\square$K). By using the characteristic, the first substrate 21 functions as a heat sink which dissipates heat generated by the second light emitting element 30.

The n-type cladding layer 22 is, for example, 1 µm thick and is made of n-type AlGaN (for example, $Al_{0.08}Ga_{0.92}N$) mixed crystal doped with silicon as an n-type impurity. The active layer 23 is, for example, 30 nm thick and has a multiple quantum well structure including a well layer and a barrier layer made of $Ga_xIn_{1-x}N$ (where, $x \geqq 0$) having different compositions. The active layer 23 functions as a light emitting portion.

The degradation preventing layer 24 is, for example, 20 nm thick and is made of p-type AlGaN (such as $Al_{0.2}Ga_{0.8}N$) mixed crystal doped with magnesium (Mg) as a p-type impurity. The p-type cladding layer 25 is, for example, 0.7 µm thick and is made of p-type AlGaN (such as $Al_{0.8}Ga_{0.92}N$) mixed crystal doped with magnesium as a p-type impurity. The p-side contact layer 26 is, for example, 0.1 µm thick and is made of p-type GaN doped with magnesium as a p-type impurity.

A part of the p-type cladding layer 25, and the p-side contact layer 26 are formed in a narrow strip shape extending in the cavity direction (perpendicular direction to the drawing sheet in FIG. 4) so as to produce what is called a laser stripe, thereby restricting a current. The p-side contact layer 26 is provided in the center portion in the direction (direction indicated by the arrow A in FIG. 4) perpendicular to the cavity direction. Side faces of the p-side contact layer 26 and a side of the p-type cladding layer 25 opposite to the degradation preventing layer 24 are covered with an insulating layer 27 made of silicon dioxide ($SiO_2$) or the like. The region in the active layer 23 corresponding to the p-side contact layer 26 is a light emitting region.

On the side of the p-side contact layer 26 opposite to the p-type cladding layer 25, a p-side electrode 28 is formed. The p-side electrode 28 is formed by depositing palladium (Pd), platinum (Pt) and gold (Au) in order from the p-side contact layer 26 side and is electrically connected to the p-side contact layer 26. The p-side electrode 28 is also electrically connected to the supporting base 11 via an adhesive layer 12. The adhesive layer 12 is made of, for example, an alloy of gold (Au) and tin (Sn), or tin.

On the side of the first substrate 21 opposite to the supporting base 11, an n-side electrode 29 is provided in correspondence with a lasing portion 50, which will be described hereinlater. The n-side electrode 29 is obtained by, for example, depositing titanium (Ti) and aluminum in order from the first substrate 21 side and alloying the deposited materials by heat treatment, and is electrically connected to the first substrate 21. The n-side electrode 29 also has the function as a wire for connecting the lasing portion 50 to the external power source. On the side of the first substrate 21 opposite to the supporting base 11, a wiring layer 13 for electrical connection to a lasing portion 40 of the second light emitting element 30 is formed with an insulating film 14 in between. The wiring layer 13 is made of, for example, a metal. Details of the lasing portion 40 will be given hereinlater.

Further, a pair of side faces at the ends in the cavity direction of the first light emitting element 20 serve as two end planes of the cavity. A pair of reflecting mirror films (not shown) are formed on the pair of end planes of the cavity. One of the pair of reflecting mirror films is set so as to reflect light produced in the active layer 23 at high reflectance, and the other film is set to reflect light at reflectance lower than the above reflectance, so that light goes out from the other film.

The second light emitting element 30 has, for example, a second substrate 31, the lasing portion 40 and the lasing portion 50. The lasing portion 40 is capable of emitting light in the range of the order of 700 nm (for example, 780 nm) and is formed on the second substrate 31 on the side thereof on which the supporting base 11 is disposed, with a buffer layer 32 in between. The lasing portion 50 is capable of emitting light in the range of the order of 600 nm (for example, 650 nm) and is formed on the second substrate 31 on the side thereof on which the supporting base 11 is disposed, with the buffer layer 32 in between. The second substrate 31 is, for example, about 100 μm thick and is made of n-type GaAs doped with silicon as an n-type impurity. The buffer layer 32 is, for example, 0.5 μm thick and is made of n-type GaAs doped with silicon as an n-type impurity. The lasing portions 40 and 50 are disposed with a space of, for example, about 200 μm or less so that their cavity directions are aligned with that of the first light emitting element 20 and the p-side contact layer 26 in the first light emitting element 20 is positioned between the lasing portions 40 and 50. Specifically, the space between a light emitting region of the lasing portion 40 and a light emitting region of the lasing portion 50 is about 120 μm, and the light emitting region of the first light emitting device 20 is positioned just in the middle of the light emitting regions of the lasing portions 40 and 50. Details of the light emitting regions of the lasing portions 40 and 50 will be given later.

The lasing portion 40 has a configuration in which an n-type cladding layer 41, an active layer 42, a p-type cladding layer 43, and a p-type cap layer 44 are laid one upon another in the order named from the second substrate 31 side. Each of the layers is made of, for example, a Group III-V compound semiconductor containing at least gallium (Ga) from Group 3B elements in the short-period type periodic table and at least arsenide (As) from Group 5B elements in the short-period type periodic table.

Specifically, the n-type cladding layer 41 is, for example, 1.5 μm thick and is made of n-type AlGaAs mixed crystal doped with silicon as an n-type impurity. The active layer 42 is, for example, 40 nm thick and has a multiple quantum well structure including a well layer and a barrier layer made of $Al_xGa_{1-x}As$ (where, $x \geq 0$) having different compositions. The active layer 42 functions as a light emitting portion and the wavelength of the output light is, for instance, in the range of the order of 700 nm. The p-type cladding layer 43 is, for example, 1.5 μm thick and is made of p-type AlGaAs mixed crystal doped with zinc as a p-type impurity. The p-type cap layer 44 is, for example, 0.5 μm thick and is made of p-type GaAs doped with zinc as a p-type impurity.

A part of the p-type cladding layer 43, and the p-type cap layer 44 are formed in a narrow strip shape extending in the cavity direction, thereby restricting a current. On both sides of the strip portion, current block regions 45 are provided. The region of the active layer 42 corresponding to the p-side cap layer 44 serves as a light emitting region.

On the side of the p-type cap layer 44 opposite to the p-type cladding layer 43, a p-side electrode 46 is formed. The p-side electrode 46 is formed by, for example, depositing titanium, platinum and gold in order from the side of the p-side cap layer 44 and alloying the deposited materials by heat treatment, and is electrically connected to the p-type cap layer 44. The p-side electrode 46 is also electrically connected to the wiring layer 13 via an adhesive layer 15. The adhesive layer 15 is made of, for example, a material similar to that of the adhesive layer 12.

The lasing portion 50 has a configuration in which an n-type cladding layer 52, an active layer 53, a p-type cladding layer 54, and a p-type cap layer 55 are laid one upon another in the order named from the side of the second substrate 31, with a buffer layer 51 in between. Each of the layers is made of, for example, a Group III-V compound semiconductor containing at least indium (In) from Group 3B elements in the short-period type periodic table and at least phosphorus (P) from Group 5B elements in the short-period type periodic table.

Specifically, the buffer layer 51 is, for example, 0.5 μm thick and is made of n-type InGaP mixed crystal doped with silicon as an n-type impurity. The n-type cladding layer 52 is, for example, 1.5 μm thick and is made of n-type AlGaInP mixed crystal doped with silicon as an n-type impurity. The active layer 53 is, for example, 35 nm thick and has a multiple quantum well structure including a well layer and a barrier layer made by $Al_xGa_yIn_{1-x-y}P$ (where $x \geq 0$ and $y \geq 0$) having different compositions. The active layer 53 functions as a light emitting portion. The p-type cladding layer 54 is, for example, 1.0 μm thick and is made of p-type AlGaInP mixed crystal doped with zinc as a p-type impurity. The p-type cap layer 55 is, for example, 0.5 μm thick and is made of p-type GaAs doped with zinc as a p-type impurity.

A part of the p-type cladding layer 54 and the p-type cap layer 55 are formed in a narrow strip shape to produce a current-restricting area extending in the cavity direction. On both sides of the strip portion, current block regions 56 are provided. The region of the active layer 53 corresponding to the p-side cap layer 55 serves as a light emitting region.

On the side of the p-type cap layer 55 opposite to the p-type cladding layer 54, a p-side electrode 57 is provided. The p-side electrode 57 is electrically connected to the p-type cap layer 55 and has, for example, the configuration similar to that of the p-side electrode 46. The p-side electrode 57 is also electrically connected to the n-side electrode 29 of the first light emitting element 20 via an adhesive layer 16 made of a material similar to that of the adhesive layer 15.

On the side of the second substrate 31 opposite to the supporting base 11, an n-side electrode 33 of the lasing portions 40 and 50 is formed. The n-side electrode 33 is obtained by, for example, depositing an alloy of gold and germanium (Ge), nickel, and gold in order from the side of the second substrate 31 and alloying the deposited materials by heat treatment.

Further, a pair of side faces at the ends in the cavity direction of the second light emitting element 30 serve as two end planes of the cavity. A pair of reflecting mirror films (not shown) are formed on the pair of end faces of the cavity of each of the lasing portions 40 and 50. The relation of reflectance between the pairs of reflecting mirror films is set so as to correspond to that between the pair of reflecting mirror films provided in the first light emitting element 20. Light is emitted from the same side of the first light emitting element 20 and the lasing portions 40 and 50 of the second light emitting element 30.

Figure 5:
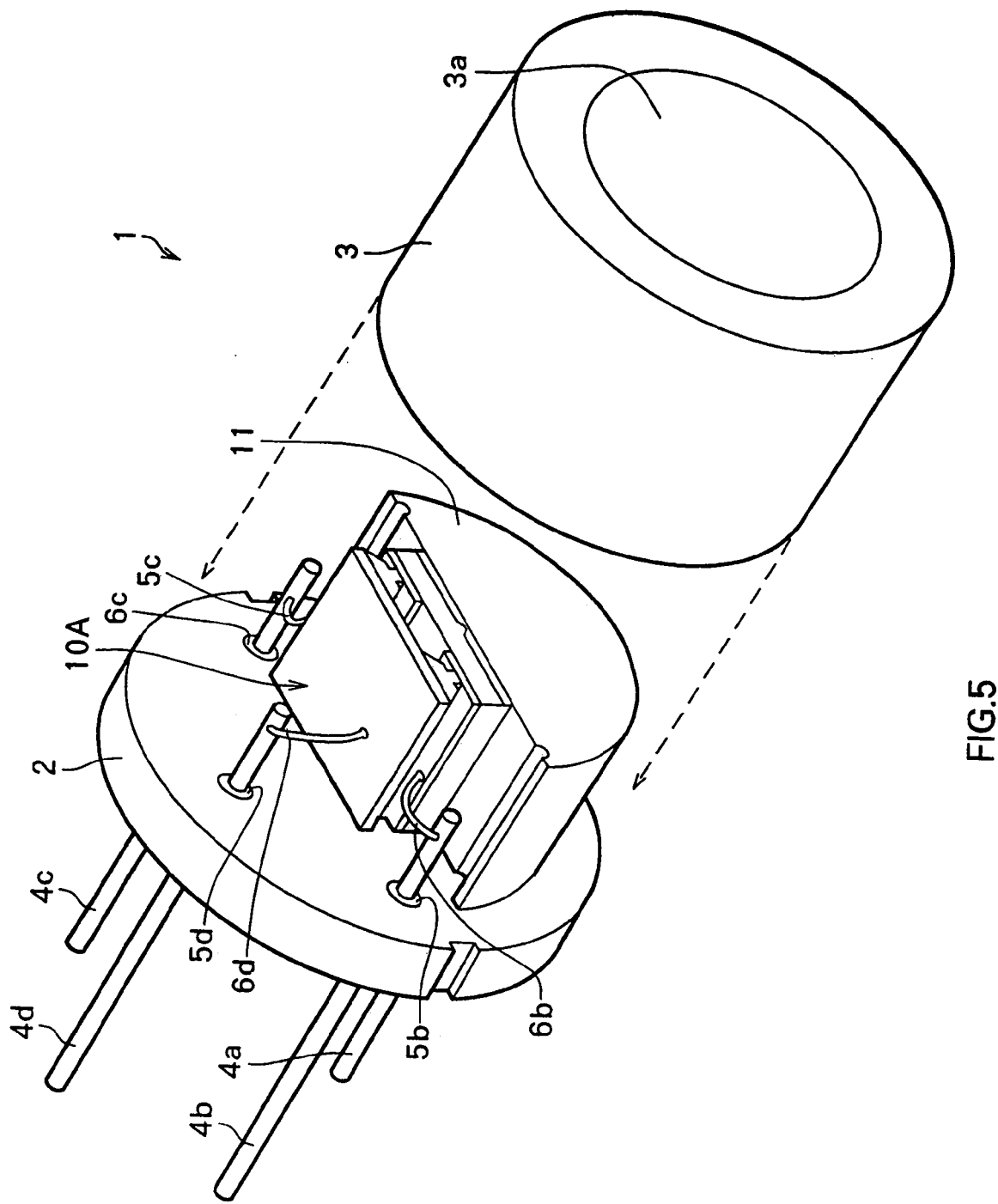
FIG. 5 is a partly-exploded perspective view showing the configuration of a package in which the light emitting device shown in FIG. 4 is enclosed.

The light emitting device 10A having such a configuration is, for example as shown in FIG. 5, enclosed in a package 1 for practical use. The package 1 has, for example, a disk-shaped supporting body 2 and a cover body 3 provided on the side of one face of the supporting body 2. Inside the cover body 3, the supporting base 11 is supported by the supporting body 2 and the light emitting device 10A is enclosed. Light emitted from the light emitting device 10A goes out from a window 3a of the cover body 3.

The package 1 is provided with a plurality of conductive pins 4a to 4d, and the pin 4a is electrically connected to the supporting base 11. The other pins 4b to 4d, for example, penetrate the supporting body 2 via insulating rings 5b to 5d respectively and extend from the inside of the cover body 3 to the outside. The wiring layer 13 is electrically connected to the pin 4b via a wire 6b. The n-side electrode 29 is electrically connected to the pin 4c via a wire 6c. The n-side electrode 33 is electrically connected to the pin 4d via a wire 6d. Although the package 1 having the four pins 4a to 4d is described here as an example, the number of pins can be set as appropriate. For example, when the wiring layer 13 and the supporting base 11 are connected to each other via a wire, the pin 4b is unnecessary and the number of pins becomes three.

Such a light emitting device 10A can be manufactured as follows. FIGS. 6A to 9B show the manufacturing steps of the method of manufacturing the light emitting device 10A.

Figure 6A:
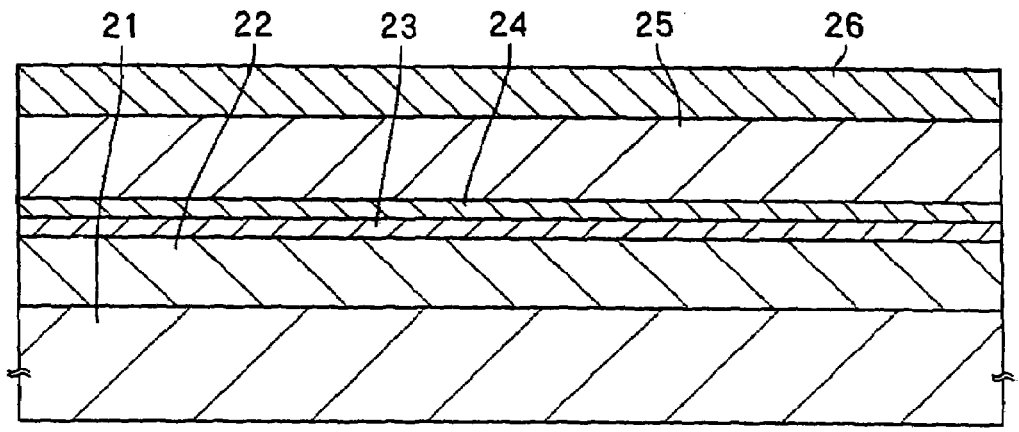
FIGS. 6A and 6B are cross sections for explaining a method of manufacturing the light emitting device shown in FIG. 4.

First, as shown in FIG. 6A, for example, the first substrate 21 made of n-type GaN having a thickness of about 400 μm is prepared. On the surface of the first substrate 21, the n-type cladding layer 22 made of n-type AlGaN mixed crystal, the active layer 23 made of InGaN mixed crystal, the degradation preventing layer 24 made of p-type AlGaN mixed crystal, the p-type cladding layer 25 made of p-type AlGaN mixed crystal, and the p-side contact layer 26 made of p-type GaN are grown in order by MOCVD. At the time of growing each of the layers, the temperature of the first substrate 21 is adjusted to, for example, 750° C. to 1100° C.

Figure 6B:
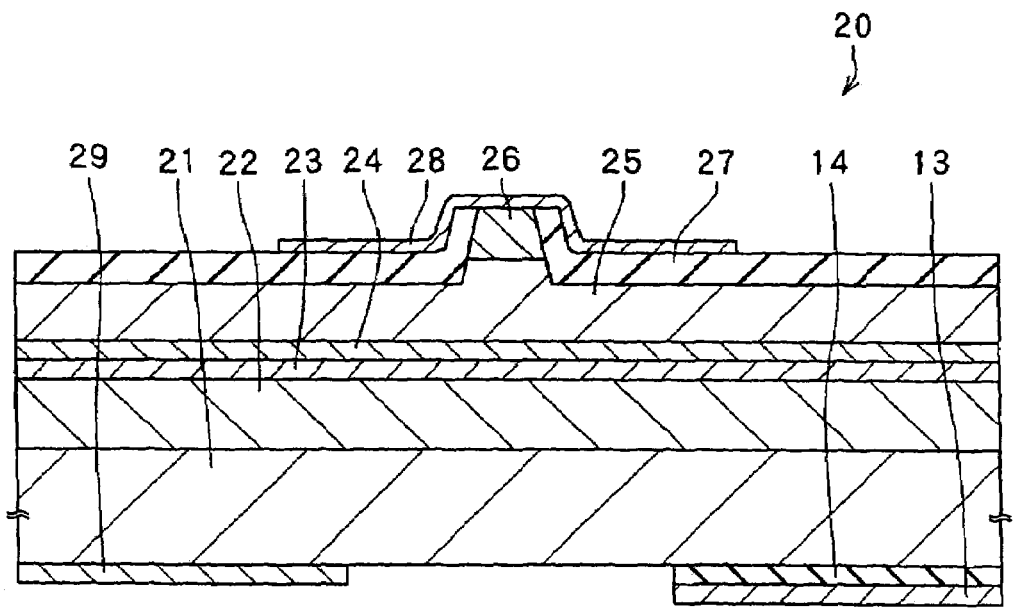

Referring to FIG. 6B, a mask (not shown) is formed on the p-side contact layer 26. The upper layer portion of each of the p-side contact layer 26 and the p-type cladding layer 25 is selectively etched into a narrow strip shape, and thus the p-type cladding layer 25 is exposed. Subsequently, by using the not-shown mask on the p-side contact layer 26, the insulating layer 27 is formed so as to cover the surface of the p-type cladding layer 25 and the side faces of the p-side contact layer 26.

After forming the insulating layer 27, on and around the surface of the p-side contact layer 26, for example, palladium, platinum, and gold are vapor-deposited in order, and the p-side electrode 28 is formed. Further, in order to easily cleave the first substrate 21 in a process which will be described hereinlater, the rear face side of the first substrate 21 is, for example, lapped and polished so that the thickness of the first substrate becomes about 100 μm.

Subsequently, on the rear face side of the first substrate 21, the insulating film 14 is formed in correspondence with the position of the lasing portion 40, and the wiring layer 13 is formed on the insulating film 14. In correspondence with the position of the lasing portion 50, for example, titanium and aluminum are vapor-deposited in order, and the n-side electrode 29 is formed. Specifically, each of the wiring layer 13 and the n-side electrode 29 is formed in a position apart from the p-side contact layer 26 by about 60 μm. In the embodiment, the first substrate 21 is made of GaN which is transparent in the visible region, and layers which are made of Group III-V compound semiconductors and are also transparent in the visible region are stacked on the first substrate 21. Therefore, the position of the p-side electrode 28 can be observed from the first substrate 21 side and the positioning in the lithography process can be performed with high precision. That is, the positions in which the wiring layer 13 and the n-side electrode 29 are formed can be precisely controlled. Since GaN of the first substrate 21 is hard, even when the thickness of the first substrate 21 is about 100 μm, there is no possibility that the first substrate 21 is cracked or the like in the lithography process.

After forming the wiring layer 13 and the n-side electrode 29, heat treatment is performed to thereby alloy the n-side electrode 29. After that, although not shown, the first substrate 21 is, for example, cleaved perpendicular to the longitudinal direction of the p-side electrode 28 in a predetermined width and a pair of reflecting mirror films are formed on the cleaved faces. In such a manner, the first light emitting element 20 is fabricated.

As shown in FIG. 7A, for example, the second substrate 31 made of n-type GaAs having a thickness of about 350 μm is prepared. On the surface of the second substrate 31, the buffer layer 32 made of n-type GaAs, the n-type cladding layer 41 made of n-type AlGaAs mixed crystal, the active layer 42 made of $Al_xGa_{1-x}As$ (where $x \geqq 0$) mixed crystal, the p-type cladding layer 43 made of p-type AlGaAs mixed crystal, and the p-type cap layer 44 made of p-type GaAs are grown in order by MOCVD. At the time of growing each of the layers, the temperature of the second substrate 31 is adjusted to, for example, 750° C. to 800° C.

As shown in FIG. 7B, a resist film $R_1$ is formed on the p-type cap layer 44 in correspondence with the region in which the lasing portion 40 is to be formed. After that, by using the resist film $R_1$ as a mask, the p-type cap layer 44 is selectively removed by using, for example, sulfuric-acid-based etchant, and the portion which is not covered with the resist film $R_1$ of the p-type cap layer 44, p-type cladding layer 43, active layer 42, and n-type cladding layer 41 is selectively removed by using hydrofluoric-acid-based etchant. After that, the resist film $R_1$ is removed.

Figure 8A:
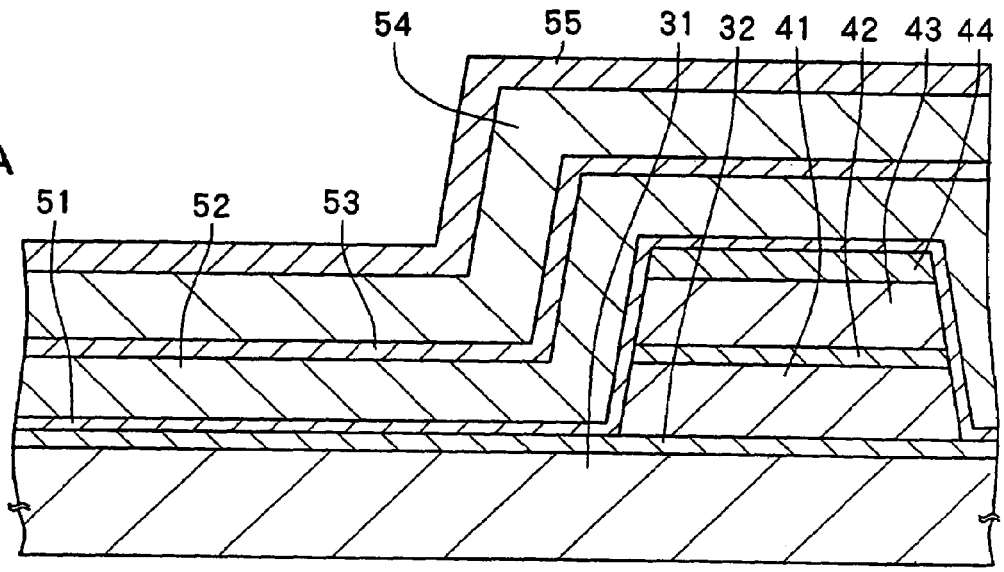
FIGS. 8A and 8B are cross sections for explaining a manufacturing process subsequent to FIG. 7B.

Subsequently, as shown in FIG. 8A, by MOCVD for example, the buffer layer 51 made of n-type InGaP mixed crystal, the n-type cladding layer 52 made of n-type AlGaInP mixed crystal, the active layer 53 made of $Al_xGa_yIn_{1-x-y}P$ (where $x \geqq 0$ and $y \geqq 0$) mixed crystal, the p-type cladding layer 54 made of p-type AlGaInP mixed crystal, and the p-type cap layer 55 made of p-type GaAs are grown in order. At the time of growing each of the layers, the temperature of the second substrate 31 is adjusted to, for example, about 680° C.

Figure 8B:
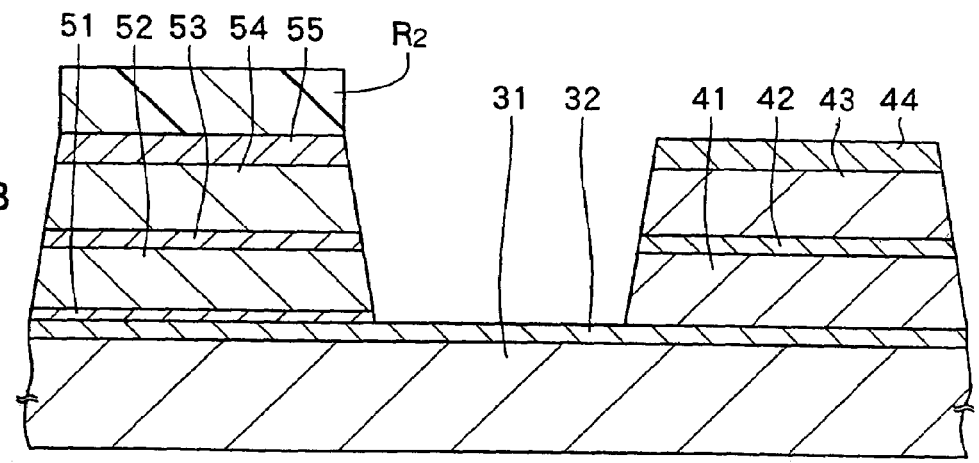

After that, as shown in FIG. 8B, a resist film $R_2$ is formed on the p-type cap layer 55 in correspondence with the region in which the lasing portion 50 is to be formed. By using the resist film $R_2$ as a mask, the p-type cap layer 55 is selectively removed by using, for example, sulfuric-acid-based etchant, and the p-type cladding layer 54, active layer 53, and n-type cladding layer 52 are selectively removed by using phosphoric-acid-based etchant and hydrochloric-acid-based etchant. The buffer layer 51 is selectively removed by using hydrochloric-acid-based etchant. After that, the resist film $R_2$ is removed.

Figure 9A:
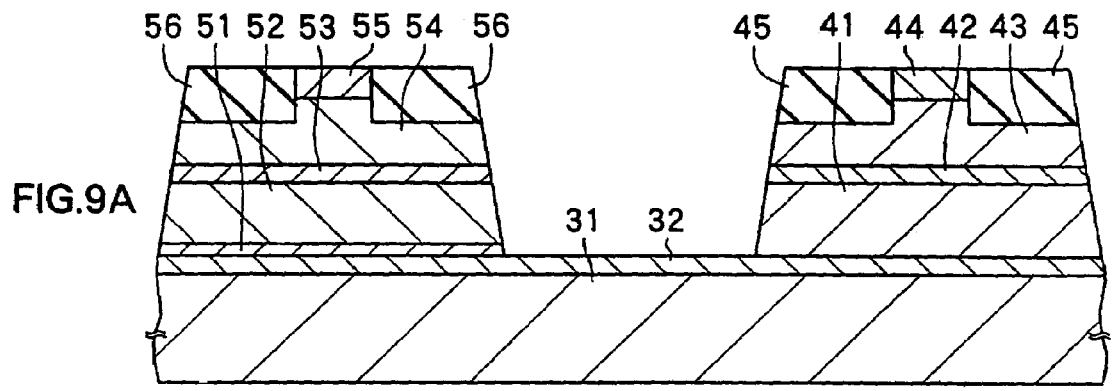
FIGS. 9A and 9B are cross sections for explaining a manufacturing process subsequent to FIG. 8B.

After removing the resist film $R_2$, as shown in FIG. 9A, for example, a narrow strip-shaped mask (not shown) is formed on the p-type cap layers 44 and 55, and an n-type impurity such as silicon is introduced into the p-type cap layers 44 and 55 and an upper layer portion of the p-type cladding layers 43 and 54 by ion implantation. The impurity introduced regions are insulated and become the current block regions 45 and 56. In this case, since the positions of the p-type cap layers 44 and 55 are defined by using lithography, the positions can be controlled accurately.

Figure 9B:
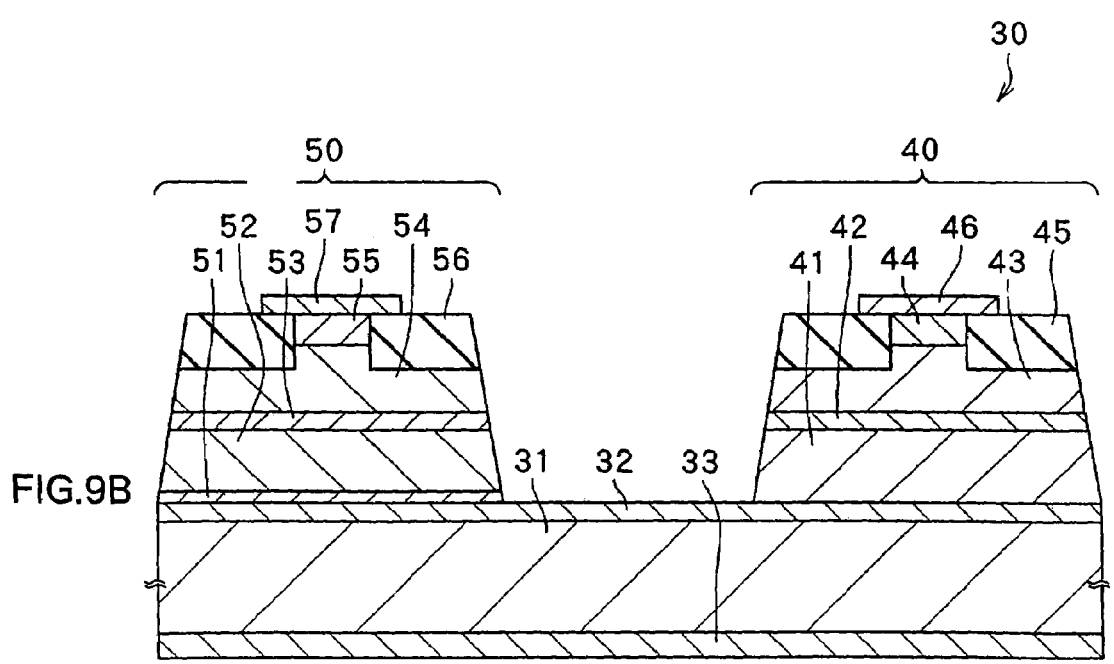

After forming the current block regions 45 and 56, as shown in FIG. 9B, for example, nickel, platinum, and gold are vapor-deposited in order on and around the p-type cap layers 44 and 55 to form the p-side electrodes 46 and 57. Further, by lapping and polishing the rear face side of the second substrate 31, the thickness of the second substrate 31 is set to, for example, about 100 μm. Subsequently, for example, an alloy of gold and germanium, nickel, and gold are vapor-deposited in order on the rear face side of the second substrate 31 to thereby form the n-side electrode 33 common to the lasing portions 40 and 50. After that, heat treatment is performed to alloy the p-side electrodes 46 and 57 and the n-side electrode 33. Further, although not shown, for example, the second substrate 31 is cleaved in predetermined width perpendicular to the longitudinal direction of the p-side electrodes 46 and 57 and a pair of reflecting mirror films are formed on the cleaved faces. In such a manner, the second light emitting element 30 is formed.

After forming the first and second light emitting elements 20 and 30 as described above, the supporting base 11 is prepared. For example, by the adhesive layer 12, the insulating layer 27 and the p-side electrode 28 of the first light emitting element 20 and the supporting base 11 are attached to each other. For example, by the adhesive layer 15, the p-side electrode 46 of the second light emitting element 30 and the wiring layer 13 are attached to each other. For example, by the adhesive layer 16, the p-side electrode 57 in the second light emitting element 30 and the p-side electrode 29 in the first light emitting element 20 are attached to each other. In such a manner, the light emitting device 10A shown in FIG. 4 is completed.

Since the second light emitting element 30 is disposed on the first light emitting element 20 so as to make the wiring layer 13 and the n-side electrode 29 formed with high positioning accuracy by using a high-precision lithography technique correspond to the p-type cap layers 44 and 55 similarly formed with high positioning accuracy by using a high-precision lithography technique, the positions of the light emitting regions are also accurately controlled.

In the case of simultaneously attaching the supporting base 11 to the first light emitting element 20, and attaching the first and second light emitting elements 20 and 30, it is preferable to form the adhesive layers 12, 15 and 16 by using the same material. In the case of performing adhesion separately, it is preferable to form an adhesive layer to be attached first by using a material having a melting point higher than that of a material of an adhesive layer to be attached later. Specifically, the adhesive layer to be attached first is made of an alloy of gold and tin, and the adhesive layer to be attached later is made of tin. Thus, the adhesion can be excellently performed in each of the times without heating the layers more than necessary.

The light emitting device 10A is enclosed in the package 1 as shown in FIG. 5 and operates as follows.

In the light emitting device 10A, when a voltage is applied between the n-side electrode 29 and the p-side electrode 28 in the first light emitting element 20 via the pins 4c and 4a of the package 1, a current is passed to the active layer 23, light is emitted by recombination of electrons and holes, and light having a wavelength of around 400 nm is emitted from the first light emitting element 20. When a predetermined voltage is applied between the n-side electrode 33 in the second light emitting element 30 and the p-side electrode 46, a current is passed to the active layer 42, light is emitted by recombination of electrons and holes, and light having a wavelength in the band on the order of 700 nm is emitted from the lasing portion 40. Further, when a predetermined voltage is applied between the n-side electrode 33 in the second light emitting element 30 and the p-side electrode 57 via the pins 4d and 4c, a current is passed to the active layer 53, light is emitted by recombination of electrons and holes, and light having a wavelength in the band on the order of 600 nm is emitted from the lasing portion 50. The light goes out from the package 1 through the light outgoing window 3a of the package 1.

Although heat is also generated at the time of light emission, since the first substrate 21 is made of a material having relatively high thermal conductivity, the heat generated by the lasing portion 40 or 50 is promptly dissipated via the first substrate 21 and the supporting base 11. The heat generated by the first light emitting element 20 is promptly dissipated via the supporting base 11.

In the light emitting device 10A according to the embodiment as described above, the first and second light emitting elements 20 and 30 are stacked. It becomes therefore unnecessary to grow Group III-V compound semiconductor layers of the nitride system, and Group III-V compound semiconductor layers of the systems AlGaAs and AlGaInP on the same substrate. Thus, the multiple-wavelength laser having a wavelength of around 400 nm can be easily obtained. The use of the light emitting device 10A makes it possible to easily produce, for example, an optical disk drive capable of optical recording/playback using any optical disk by a plurality of kinds of light sources.

Especially, the first light emitting element 20 has a Group III-V compound semiconductor layer of the nitride system so as to emit light having a wavelength of around 400 nm. Thus, by mounting the light emitting device 10A on an optical device such as an optical disk drive, optical recording/playback using an optical disk on which information is recorded at higher recording area density becomes possible.

Since the first substrate 21 is made of the material which is transparent in the visible region, the n-side electrode 29 and the wiring layer 13 can be formed with high positioning accuracy by using the lithography technique. By attaching the p-side electrodes 46 and 57 in the second light emitting element 30 formed with high positioning accuracy by using the lithography technique, the positions of the light emitting regions of the first and second light emitting elements 20 and 30 can be accurately controlled. Further, by setting each of the intervals to a predetermined small value, light emitted from each of the light emitting elements is allowed to come out through a region of a small diameter.

In addition, the first substrate 21 is made of the material having high thermal conductivity, so that the heat generated at the time of light emission in the lasing portions 40 and 50 can be promptly dissipated to the supporting base 11 via the first substrate 21. Thus, even when the second light emitting element 30 is disposed on the first light emitting element 20, the temperature of the light emitting element 30 can be prevented from rising, so that the device can stably operate for long time.

Figure 10:
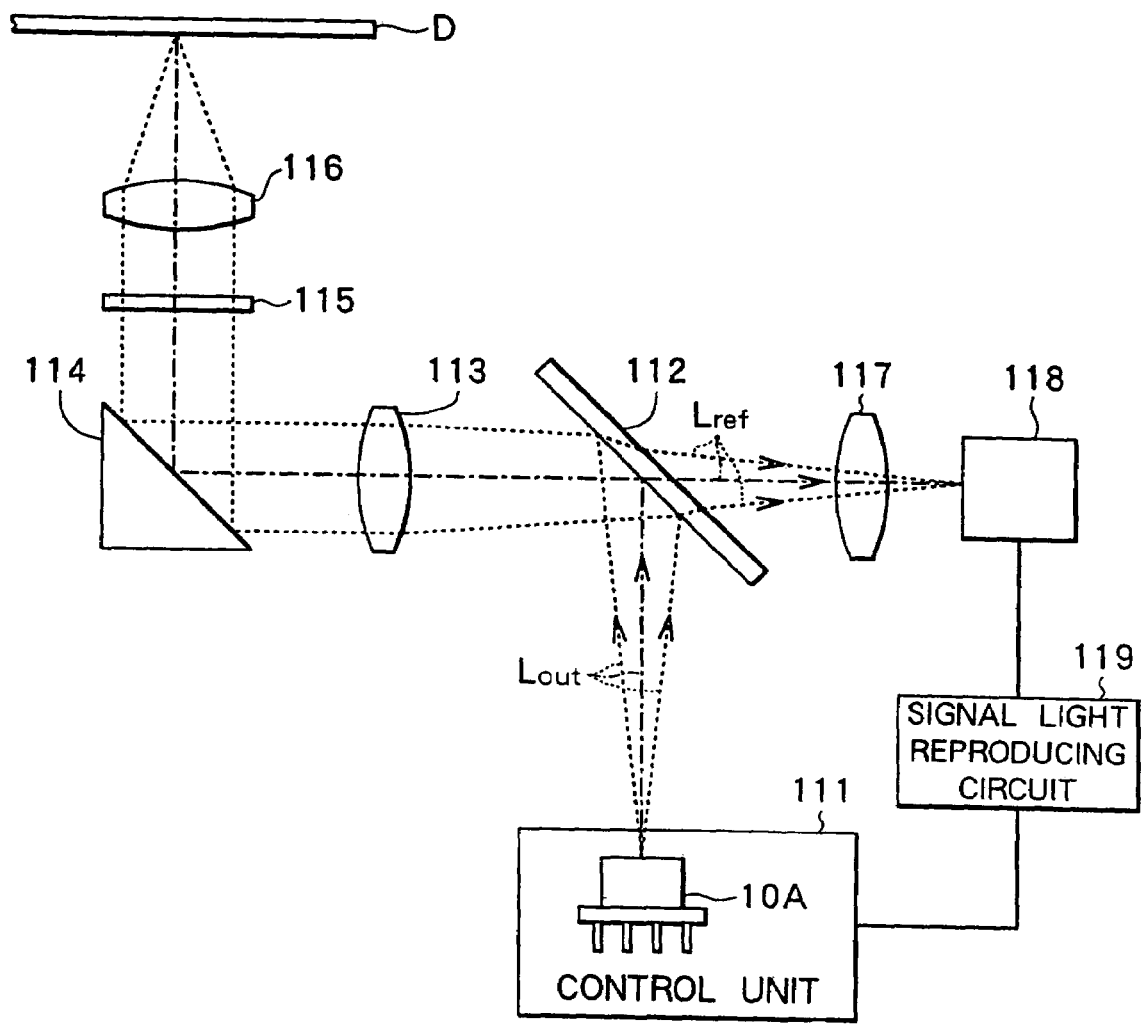
FIG. 10 is a diagram showing the configuration of an optical disk recording/playback apparatus using the light emitting device shown in FIG. 4.

The light emitting device 10A is used for, for example, an optical disk recording/playback apparatus as an optical device. FIG. 10 schematically shows the configuration of the optical disk recording/playback apparatus. The optical disk recording/playback apparatus reproduces information recorded on an optical disk by using light of different wavelengths and records information onto an optical disk. The optical disk recording/playback apparatus has an optical system for guiding outgoing light $L_{out}$ having a predetermined wavelength emitted from the light emitting device 10A to an optical disk D and reading signal light (reflection light $L_{ref}$) from the optical disk D under the control of the light emitting device 10A and a control unit 111. The optical system has a beam splitter 112, a collimator lens 113, a mirror 114, a quarter-wave plate 115, an objective lens 116, a signal light detection lens 117, a signal light detection photoreceiving device 118, and a signal light reproducing circuit 119.

In the optical disk recording/playback apparatus, the outgoing light $L_{out}$ having, for example, strong intensity from the light emitting device 10 is reflected by the beam splitter 112, made parallel light by the collimator lens 113, and reflected by the mirror 114. The outgoing light $L_{out}$ reflected by the mirror 114 passes through the quarter-wave plate 115. After that, the outgoing light $L_{out}$ is condensed by the objective lens 116, and is incident on the optical disk D, thereby writing information onto the optical disk D. The outgoing light $L_{out}$ having, for example, weak intensity from the light emitting device 10 passes through the optical components as described above and is incident on and reflected by the optical disk D. The reflection light $L_{ref}$ passes through the objective lens 116, quarter-wave plate 115, mirror 114, collimator lens 113, beam splitter 112, and signal light detection lens 117, and is incident on the signal light detection photoreceiving device 118 where the light is converted to an electric signal. After that, the information written on the optical disk D is reproduced by the signal light reproducing circuit 119.

As described above, the light emitting device 10A according to the embodiment can be enclosed in a single package and the outgoing light $L_{out}$ is emitted from the plurality of light emitting regions spaced accurately. By using the light emitting device 10A, the plurality of outgoing light $L_{out}$ of different wavelengths can be guided to predetermined positions by using the common optical system. Thus, the small, low-cost optical disk recording/playback apparatus having a simplified configuration can be realized. Since an error in the light emitting point intervals is extremely small, the position of the reflection light $L_{ref}$ forming an image in a photoreceiving portion (signal light detection photoreceiving device 118) can be prevented from varying according to optical disk recording/playback apparatuses. That is, the optical system can be easily designed and the yield of the optical disk recording/playback apparatus can be improved.

The light emitting device 10A of the embodiment can realize light emission of three wavelengths, that is, around 400 nm, in the range of the order of 600 nm, and in the range of the order of 700 nm. This enables optical recording/playback by using not only existing various optical disks such as CD-ROM (Read Only Memory), CD-R, CD-RW, MD, and DVD-ROM, but also what is called DVD-RAM (Random Access Memory), DVD+RW, DVD-R/RW and the like which are currently proposed as rewritable mass-storage disks. Further, optical recording/playback also becomes possible using next-generation recordable optical disks having higher recording area density (for example, 20 G bytes or more) (such as optical disks used for a DVR (Digital Video Recorder) or VDR (Video Disk Recorder) which are proposed as optical disk apparatuses of the next generation). The use of such recordable mass-storage disks of the next generation enables video data recording and reproduction of recorded data (images) with high picture quality and excellent operability.

The description given above relates to an example in which the light emitting device 10A is applied to the optical disk recording/playback apparatus. However, obviously, the light emitting device 10A have extensive application to various optical apparatuses such as optical disk playback apparatuses, optical disk recording apparatuses, magnetooptic disk apparatuses for optical recording/playback using magnetooptical disks (MOs), and optical communication systems. It can be also applied to equipment having a vehicle-mounted semiconductor laser apparatus which has to operate at high temperature, and the like.

Second Embodiment

Figure 11:
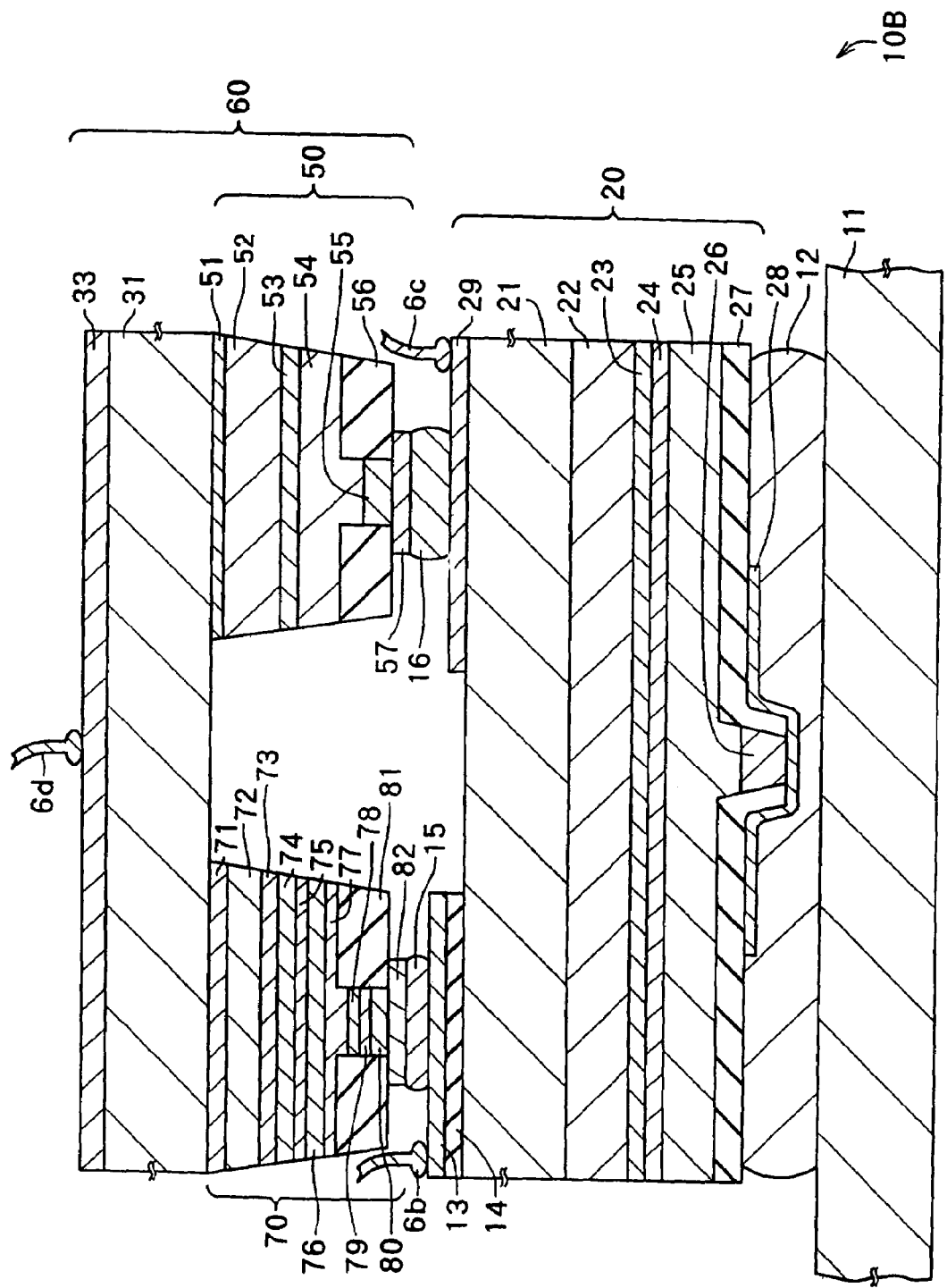
FIG. 11 is a cross section showing the construction of a light emitting device according to a second embodiment of the invention.

FIG. 11 shows a sectional structure of a light emitting device 10B according to a second embodiment of the invention. The light emitting device 10B has the same configuration, action, and effects as those of the light emitting device 10A except that a second light emitting element 60 is provided in place of the second light emitting element 30 in the light emitting device 10A in the first embodiment. The same reference numerals are given to the same components as those of the first embodiment and their detailed description will not be repeated.

The second light emitting element 60 in the second embodiment has the same configuration as that of the second light emitting element 30 except that a lasing portion 70 capable of emitting light having a wavelength in the band on the order of 500 nm (for example, 520 nm) is provided in place of the lasing portion 40 of the second light emitting element 30 in the first embodiment and the buffer layer 32 is not provided.

The lasing portion 70 has a configuration in which, for example, an n-type cladding layer 72, a guide layer 73, an active layer 74, a guide layer 75, a p-type cladding layer 76, a first p-type semiconductor layer 77, a second p-type semiconductor layer 78, a p-type superlattice layer 79, and a p-side contact layer 80 are laid one upon another in the order named on the second substrate 31 on the side thereof on which the supporting base 11 is disposed, with a buffer layer 71 in between. Each of the layers is made of, for example, a Group II-VI compound semiconductor containing at least one element selected from the group of Group 2A or 2B elements in the short-period type periodic table consisting of zinc (Zn), cadmium (Cd), mercury (Hg), beryllium (Be) and magnesium (Mg), and at least one element selected from the group of Group 6B elements in the short-period type periodic table consisting of sulfur (S), selenium (Se) and tellurium (Te).

Specifically, the buffer layer 71 is made by depositing in order an n-type GaAs film doped with silicon as an n-type impurity, a ZnSe film doped with chlorine (Cl) as an n-type impurity, and a ZnSSe mixed crystal layer doped with chlorine as an n-type impurity, from the side of the second substrate 31. The thickness of the buffer layer 71 is, for example, 100 nm. The n-type cladding layer 72 is, for example, 1 µm thick and is made of n-type ZnMgSSe mixed crystal doped with chlorine as an n-type impurity. The guide layer 73 is, for example, 0.1 µm thick and is made of n-type ZnSSe mixed crystal doped with chlorine as an n-type impurity or undoped ZnSSe mixed crystal. The active layer 74 is, for example, 20 nm thick and has a multiple quantum well structure of a well layer and a barrier layer which are made of $Zn_xCd_{1-x}Se$ (where $x \geq 0$) mixed crystal of different compositions. The active layer 74 functions as a light emitting portion.

The guide layer 75 is, for example, 0.1 µm thick and is made of p-type ZnSSe mixed crystal doped with nitrogen as a p-type impurity or undoped ZnSSe mixed crystal. The p-type cladding layer 76 has, for example, 1.0 µm thick and is made of p-type ZnMgSSe mixed crystal doped with nitrogen as a p-type impurity. The first p-type semiconductor layer 77 is, for example, 0.2 µm thick and is made of p-type ZnSSe mixed crystal doped with nitrogen as a p-type impurity. The second p-type semiconductor layer 78 is, for example, 0.2 µm thick and is made of p-type ZnSe doped with nitrogen as a p-type impurity. The p-type superlattice layer 79 is, for example, 35 nm thick and is formed by alternately depositing a p-type ZnSe film doped with nitrogen as a p-type impurity and a p-type ZnTe film doped with nitrogen as a p-type impurity. The p-side contact layer 80 is, for example, 0.1 µm thick and is made of p-type ZnTe doped with nitrogen as a p-type impurity.

A part of the first p-type semiconductor layer 77, second p-type semiconductor layer 78, p-type superlattice layer 79, and p-side contact layer 80 are formed in a narrow strip shape extending in the cavity direction so that a current is restricted. On both sides of the strip portion, current block regions 81 are provided. The region in the active layer 74 corresponding to the p-side contact layer 80 serves as a light emitting region.

On the side of the p-type contact layer 80 opposite to the p-type superlattice layer 79, a p-side electrode 82 is formed. The p-side electrode 82 is formed by, for example, depositing in order palladium (Pd), platinum, and gold from the side of the p-side contact layer 80 and alloying the deposited materials by heat treatment, and is electrically connected to the p-side contact layer 80. The p-side electrode 82 is also electrically connected to the wiring layer 13 via the adhesive layer 15.

The light emitting device 10B having such a configuration can be manufactured in a manner similar to the first embodiment except that the second light emitting element 60 is formed in place of the second light emitting element 30 in the light emitting device 10A.

Figure 12A:
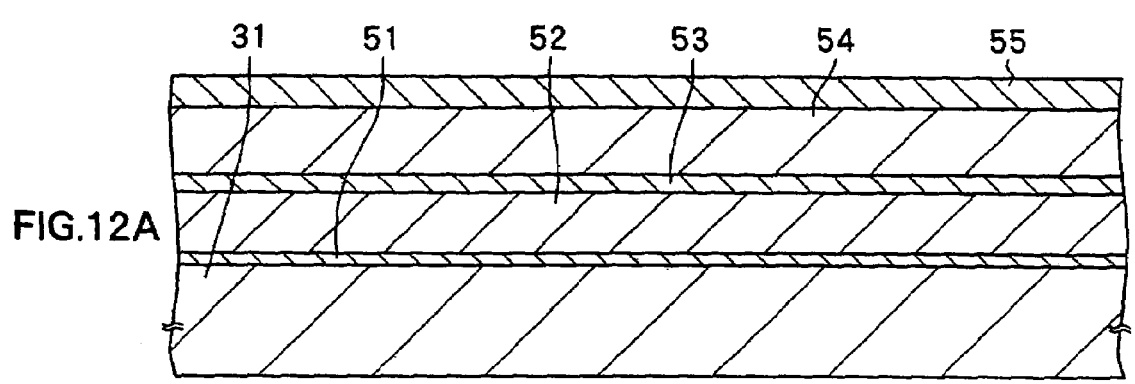
FIGS. 12A and 12B are cross sections for explaining a method of manufacturing a light emitting device shown in FIG. 11.

Specifically, the second light emitting element 60 is produced as follows. First, as shown in FIG. 12A, in a manner similar to the first embodiment, for example, the buffer layer 51 made of n-type InGaP mixed crystal, the n-type cladding layer 52 made of n-type AlGaInP mixed crystal, the active layer 53 made of $Al_xGa_yIn_{1-x-y}P$ (where $x \geq 0$ and $y \geq 0$) mixed crystal, the p-type cladding layer 54 made of p-type AlGaInP mixed crystal, and the p-type cap layer 55 made of p-type GaAs are grown in order on the surface of the second substrate 31 made of n-type GaAs.

Figure 12B:
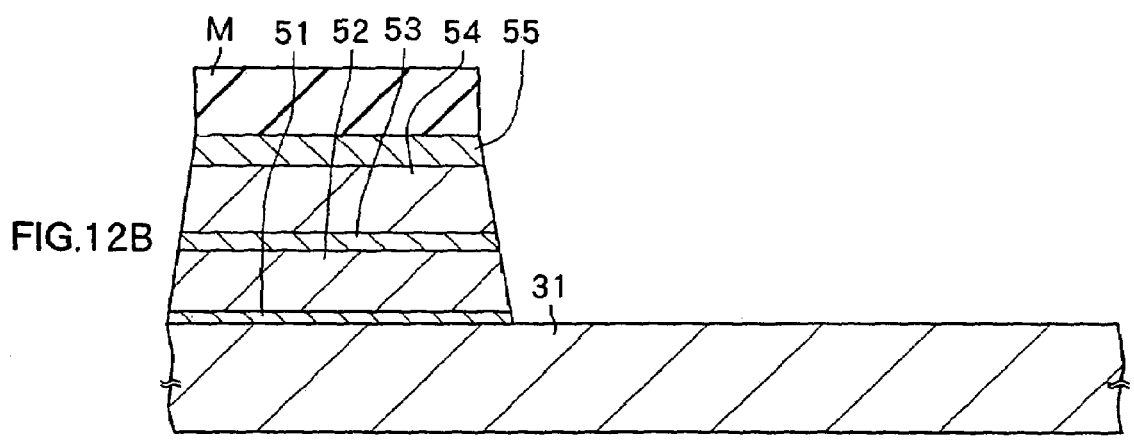

Subsequently, as shown in FIG. 12B, in correspondence with the region in which the lasing portion 50 is to be formed, a mask M made of silicon dioxide or silicon nitride ($Si_3N_4$) is formed by, for example, CVD (Chemical Vapor Deposition) on the p-type cap layer 55. By using the mask M, etching such as RIE (Reactive Ion Etching) is performed, thereby selectively removing the p-type cap layer 55, p-type cladding layer 54, active layer 53, n-type cladding layer 52, and buffer layer 51.

Figure 13A:
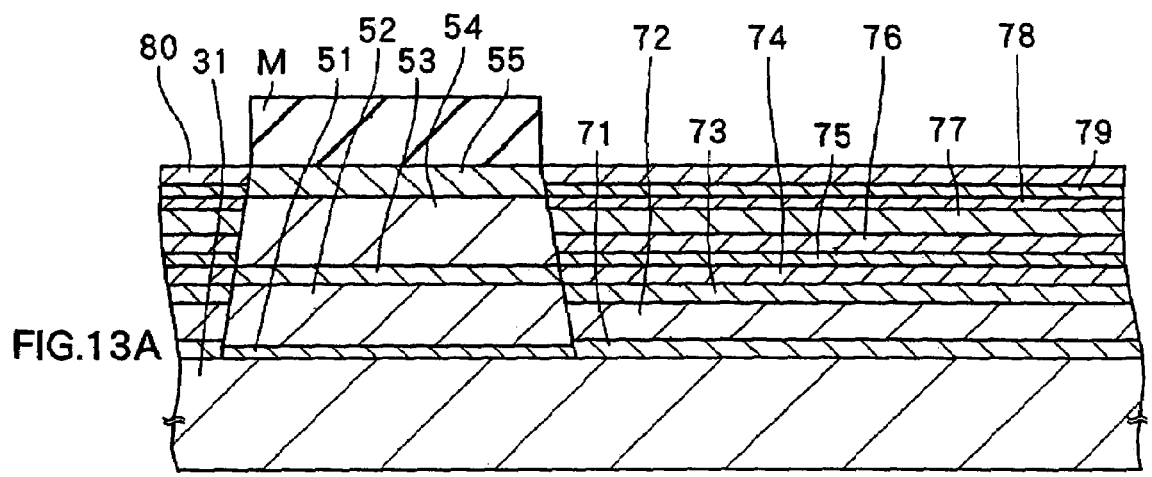
FIGS. 13A and 13B are cross sections for explaining a manufacturing process subsequent to FIG. 12B.

Subsequently, as shown in FIG. 13A, on the surface of the second substrate 31, by MBE (Molecular Beam Epitaxy) for example, the buffer layer 71 in which an n-type GaAs film, an n-type ZnSe film, and an n-type ZnSSe mixed crystal layer are deposited in the order named, the n-type cladding layer 72 made of n-type ZnMgSSe mixed crystal, the guide layer 73 made of n-type ZnSSe mixed crystal, the active layer 74 made of $Zn_xSe_{1-x}Cd$ (where $x \geq 0$) mixed crystal, the guide layer 75 made of p-type ZnSSe mixed crystal, the p-type cladding layer 76 made of p-type ZnMgSSe mixed crystal, the first p-type semiconductor layer 77 made of p-type ZnSSe mixed crystal, the second p-type semiconductor layer 78 made of p-type ZnSe, the p-type superlattice layer 79 in which a p-type ZnSe film and a p-type ZnTe film are alternately deposited, and the p-side contact layer 80 made of p-type ZnTe are grown in order. At the time of growing each of the layers, the temperature of the second substrate 31 is adjusted to, for example, about 280° C. After that, the mask M is removed.

Figure 13B:
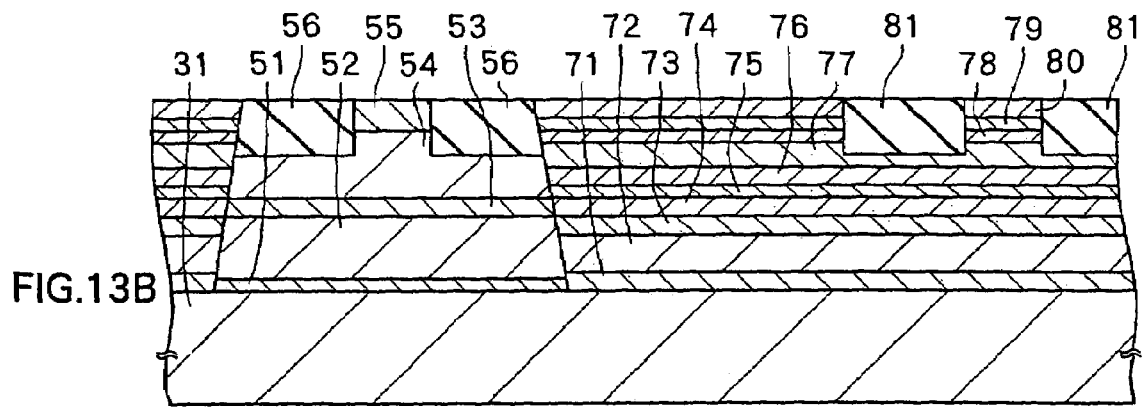

After removing the mask M, as shown in FIG. 13B, for example, a mask (not shown) having an opening corresponding to the region in which the current block region 56 is to be created is formed, and an n-type impurity such as chlorine is introduced by ion implantation, thereby forming the current block regions 56. A mask (not shown) having an opening corresponding to the region in which the current block region 81 is to be created is formed on the entire surface, and an n-type impurity such as chlorine is introduced by ion implantation to the p-side contact layer 80, p-type superlattice layer 79, second p-type semiconductor layer 78, and to the upper layer portion of the first p-type semiconductor layer 77, thereby forming the current block region 81. Since the lithography technique is used here in a manner similar to the first embodiment, the positions of the light emitting regions in the lasing portions 50 and 70 can be precisely defined.

Figure 14:
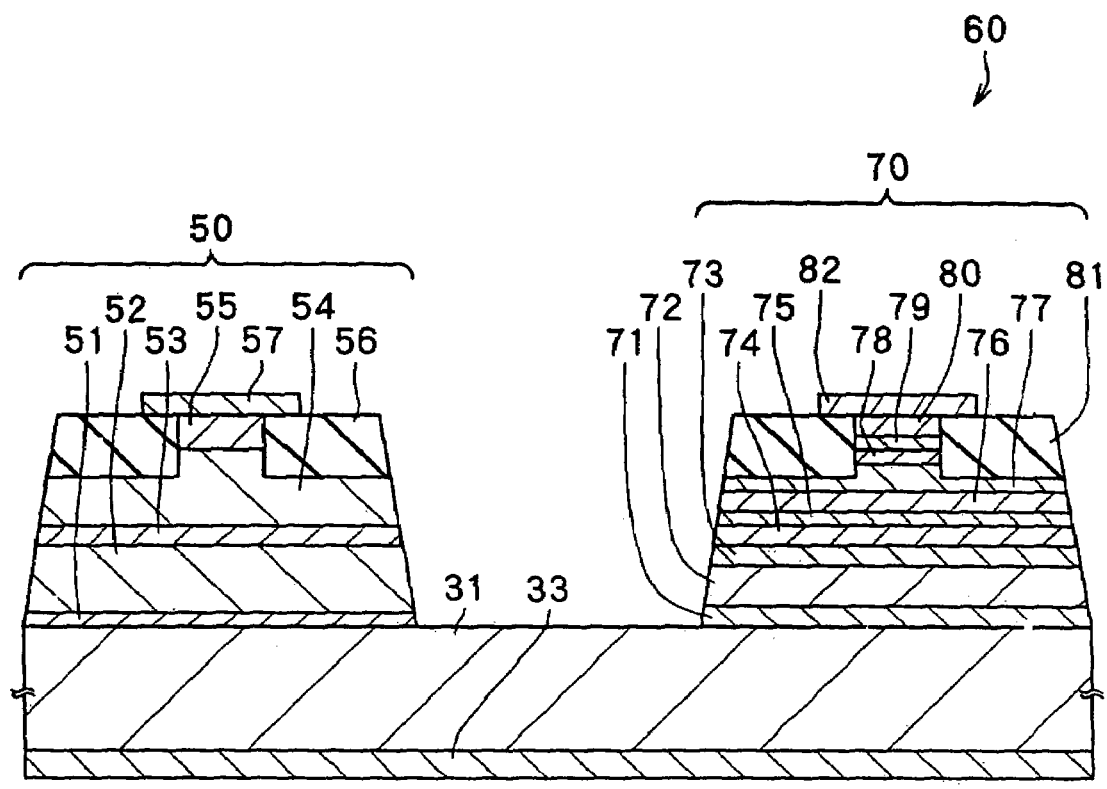
FIG. 14 is a cross section for explaining a manufacturing process subsequent to FIG. 13B.

After forming the current block regions 56 and 81, as shown in FIG. 14, on and around the surface of the p-type cap layer 55, for example, titanium, platinum, and gold are vapor-deposited in order, to thereby form the p-side electrode 57. On and around the surface of the p-side contact layer 80, for example, palladium, platinum, and gold are vapor-deposited in order, to form the p-side electrode 82. Subsequently, a mask (not shown) is formed in correspondence with the region in which the lasing portions 50 and 70 are formed, and the portion from the p-side contact layer 80 to the buffer layer 71 is selectively removed.

After selectively removing the portion from the p-side contact layer 80 to the buffer layer 71, the rear face side of the second substrate 31 is, for example, lapped and polished to form the n-side electrode 33 on the rear face side of the second substrate 31 in a manner similar to the first embodiment. Subsequently, heat treatment is performed to alloy the p-side electrodes 57 and 82 and the n-side electrode 33. Finally, the second substrate 31 is cleaved in a predetermined width perpendicularly to the longitudinal direction of the p-side electrodes 57 and 82, and a pair of not-shown reflecting mirror films are formed on the cleaved faces. In such a manner, the second light emitting element 60 is fabricated.

Since the light emitting device 10B according to the embodiment has the first light emitting element 20 capable of emitting light in the band on the order of 400 nm and the second light emitting element 60 having the lasing portion 70 capable of emitting light in the band on the order of 500 nm and the lasing portion 50 capable of emitting light in the range of the order of 700 nm, the light emitting device for emitting light of three primary colors of red (R), green (G), and blue (B) can be realized. The light emitting device 10B can be used as a light source of not only the optical disk drive but also full-color displays.

In the case of using the light emitting device 10B as light sources of full-color displays, by adjusting the composition of the material of each of the active layers 23, 53, and 74 as appropriate, light emitted from each of the light emitting portions can have a desired hue.

Figure 15:
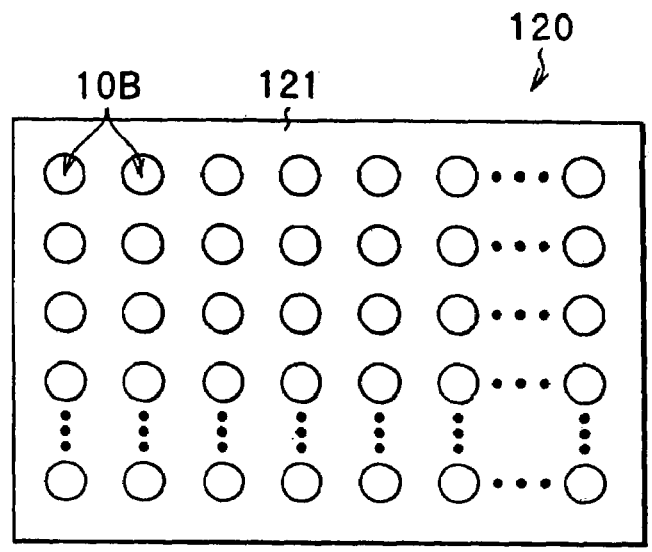
FIG. 15 is a plan view showing a schematic configuration of a display apparatus using the light emitting device illustrated in FIG. 11.

FIG. 15 shows a schematic configuration of a display 120 using the light emitting device 10B according to the embodiment. The display 120 has a board 121 and a plurality of light emitting devices 10B according to the embodiment provided on one face of the board 121. For example, each of the light emitting devices 10B is enclosed in the package 1 as shown in FIG. 5 and the light emitting devices 10B are arranged in a matrix of M rows and N columns (where, M and N are natural numbers). Although not shown in FIG. 15, on the board 121, common lines 122 and 123 in the column direction and common lines 124 and 125 in the row direction are formed.

Figure 16:
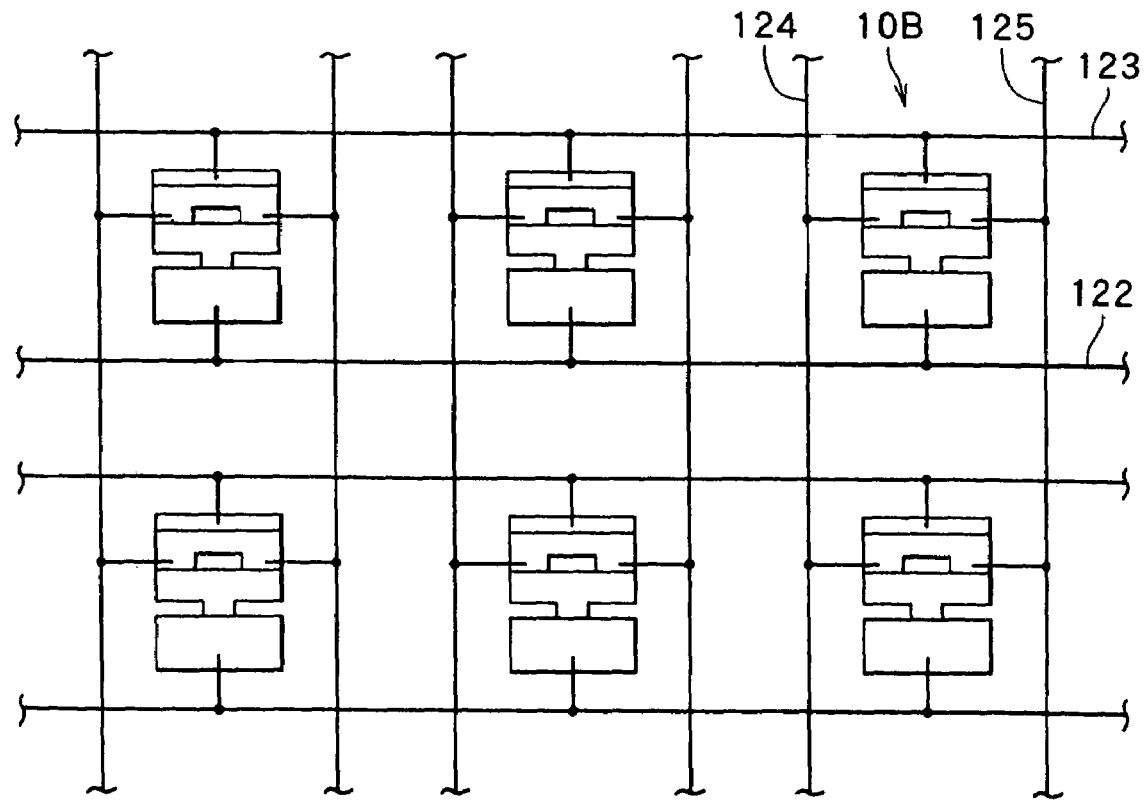
FIG. 16 is a diagram showing the configuration of a main portion of a driving circuit of the display apparatus illustrated in FIG. 15.

FIG. 16 shows a schematic configuration of a driving circuit of the display 120. The supporting base 11 of each of the light emitting devices 10B is connected to the common line 122 in the column direction via a wire, and the n-side electrode 33 in the second light emitting element 60 is connected to the common line 123 in the column direction via a wire. The wiring layer 13 is connected to the common line 124 in the row direction, and the n-side electrode 29 in the first light emitting element 20 is connected to the common line 125 in the column direction via a wire. The common lines 122 to 125 are connected to a control unit (not shown) and a desired color is displayed according to a signal from the control unit.

The light emitting device 10B of the second embodiment acts in a manner similar to the light emitting device 10A of the first embodiment except that, when a voltage is applied between the n-side electrode 33 and the p-side electrode 82 via the pins 4d and 4b of the package 1 (FIG. 5), a current is passed to the active layer 74, light is emitted by recombination of electrons and holes, and light having a wavelength in the band on the order of 500 nm is emitted from the lasing portion 70.

Third Embodiment

Figure 17:
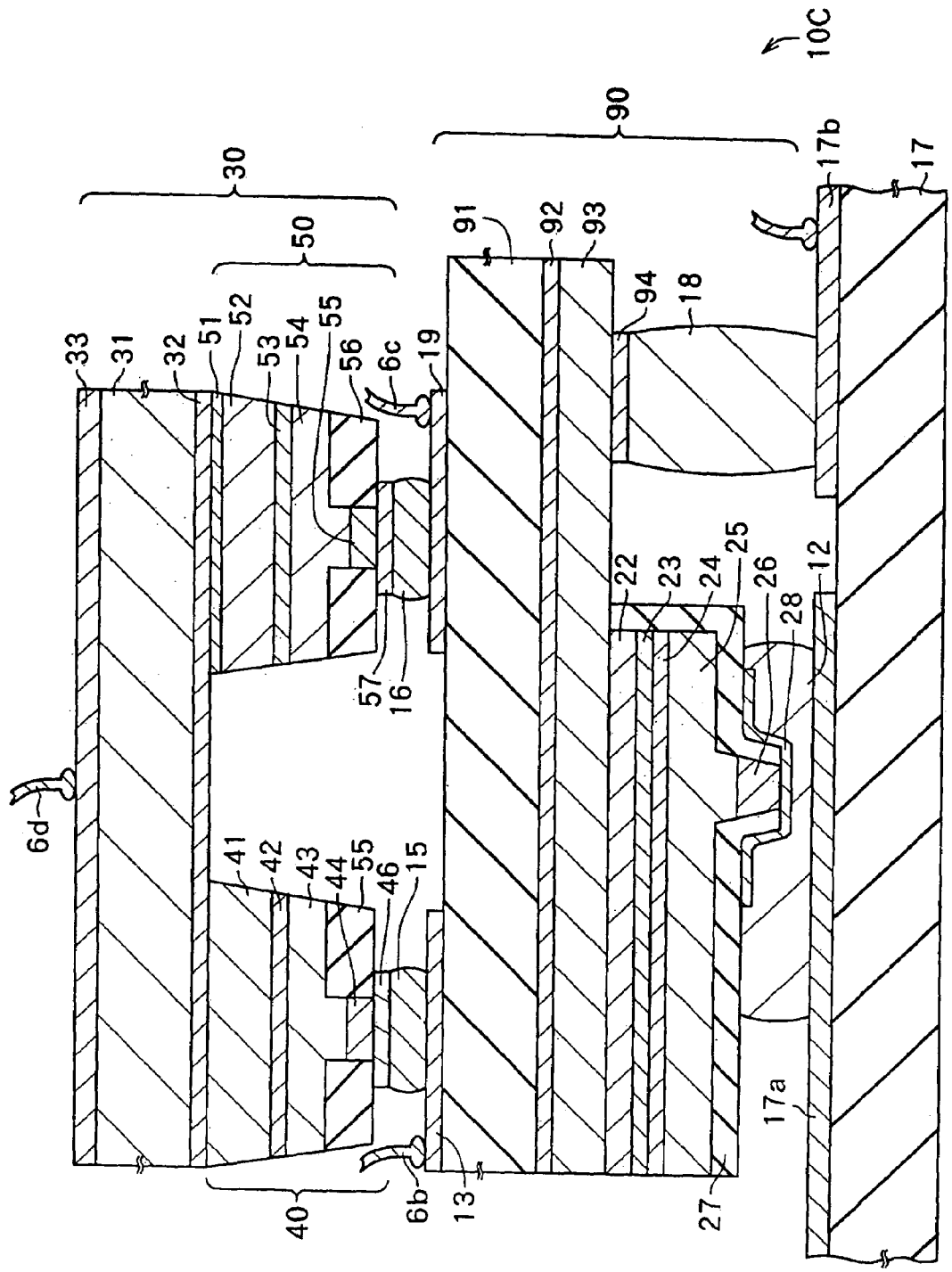
FIG. 17 is a cross section showing the configuration of a light emitting device according to a third embodiment of the invention.

FIG. 17 shows a sectional structure of a light emitting device 10C according to a third embodiment of the invention. The light emitting device 10C has the same configuration, action, and effects as those of the light emitting device 10A of the first embodiment except that a first light emitting element 90 is provided in place of the first light emitting element 20 in the light emitting device 10A of the first embodiment, and a supporting base 17 is provided in place of the supporting base 11. The same reference numerals are given to the same components as those of the first embodiment and their detailed description will not be repeated here.

The first light emitting element 90 is largely different from the first light emitting element 20 with respect to the point that a different material is used for a first substrate 91. For example, the first substrate 91 is made of sapphire having a thickness of about 80 μm. Sapphire is an insulating material and is transparent in the visible region like GaN. The first light emitting element 90 has a configuration in which, for example, on the c-cut plane of the first substrate 91, an n-side contact layer 93, the n-type cladding layer 22, the active layer 23, the degradation preventing layer 24, the p-type cladding layer 25, and the p-type contact layer 26 are laid one upon another in the order named from the side of the first substrate 91 with a buffer layer 92 in between. The insulating layer 27 is formed on the surface of the p-type cladding layer 25 and the side faces of the p-side contact layer 26, and the p-side electrode 28 is formed on the side of the p-side contact layer 26 opposite to the p-type cladding layer 25.

The buffer layer 92 has, for example, 30 nm thick and is made of undoped GaN or n-type GaN doped with silicon as an n-type impurity. The n-side contact layer 93 is, for example, 5 μm thick and is made of n-type GaN doped with silicon as an n-type impurity.

The n-side contact layer 93 has an exposed portion in which the n-type cladding layer 22, the active layer 23, the degradation preventing layer 24, the p-type cladding layer 25, and the p-side contact layer 26 are not formed. In the exposed portion, for example, an n-side electrode 94 in which titanium and aluminum are deposited in order from the side of the n-side contact layer 93 and alloyed by heat treatment is formed. In the embodiment, the insulating film 27 is provided so as to cover also the side faces of the p-type cladding layer 25, degradation preventing layer 24, active layer 23, and cladding layer 22.

The supporting base 17 is made of an insulating material having high thermal conductivity such as aluminum nitride (AlN). On one face of the supporting base 17, a wiring layer 17a made of a metal is provided in correspondence with the p-side electrode 28 in the first light emitting element 90, and a wiring layer 17b made of a metal is provided in correspondence with the n-side electrode 94. The p-side electrode 28 and the wiring layer 17a are attached to each other with the adhesion layer 12 in between, and the n-side electrode 94 and the wiring layer 17b are attached to each other with an adhesion layer 18 in between.

On the side of the first substrate 91 opposite to the supporting base 17, the wiring layer 13 is provided in a manner similar to the first embodiment, and a wiring layer 19 made of a metal is provided for connecting the lasing portion 50 to the external power source is provided in place of the n-side electrode 29 in the first embodiment.

The light emitting device 10C is used by, for example, being enclosed in a package in a manner similar to the first embodiment. In the package, a placement stage is provided on one face of the supporting body, and the supporting base 17 is placed on the placement stage. The package has, for instance, five pins which are electrically connected to the wiring layers 13, 17a, 17b, and 19 and the n-side electrode 33 via wires. In this case as well, the number of pins can be set as appropriate in a manner similar to the first embodiment.

The light emitting device 10C can be manufactured as follows.

Figure 18A:
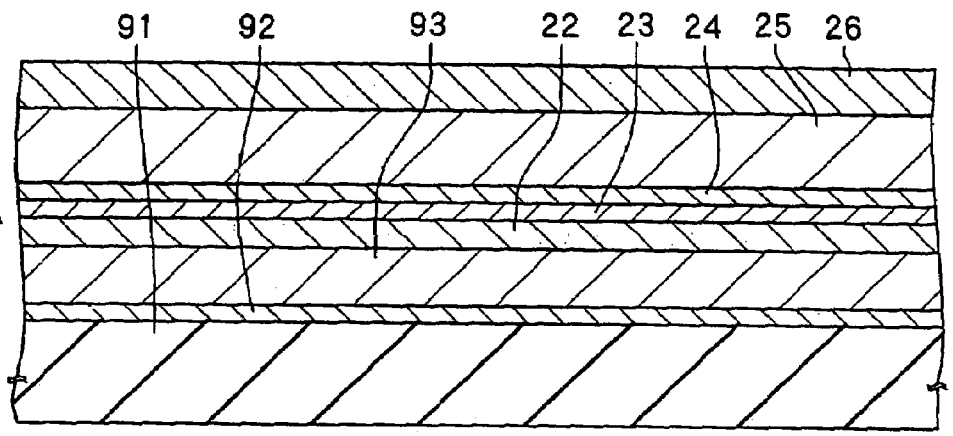
FIGS. 18A and 18B are cross sections for explaining a method of manufacturing the light emitting device illustrated in FIG. 17.

First, as shown in FIG. 18A, for example, the first substrate 91 made of sapphire having a thickness of about 400 μm is prepared. On the c-cut plane of the first substrate 91, the buffer layer 92 made of undoped GaN or n-type GaN is grown. At this time, the temperature of the first substrate 91 is set to, for example, 500° C. Subsequently, on the buffer layer 92, the n-type contact layer 93 made of n-type GaN, the n-type cladding layer 22 made of n-type AlGaN mixed crystal, the active layer 23 made of InGaN mixed crystal, the degradation preventing layer 24 made of p-type AlGaN mixed crystal, the p-type cladding layer 25 made of p-type AlGaN mixed crystal, and the p-side contact layer 26 made of p-type GaN are grown in order. At the time of growing each of the layers, the temperature of the first substrate 91 is adjusted to an appropriate temperature, for example, from 750 to 1100° C.

Figure 18B:
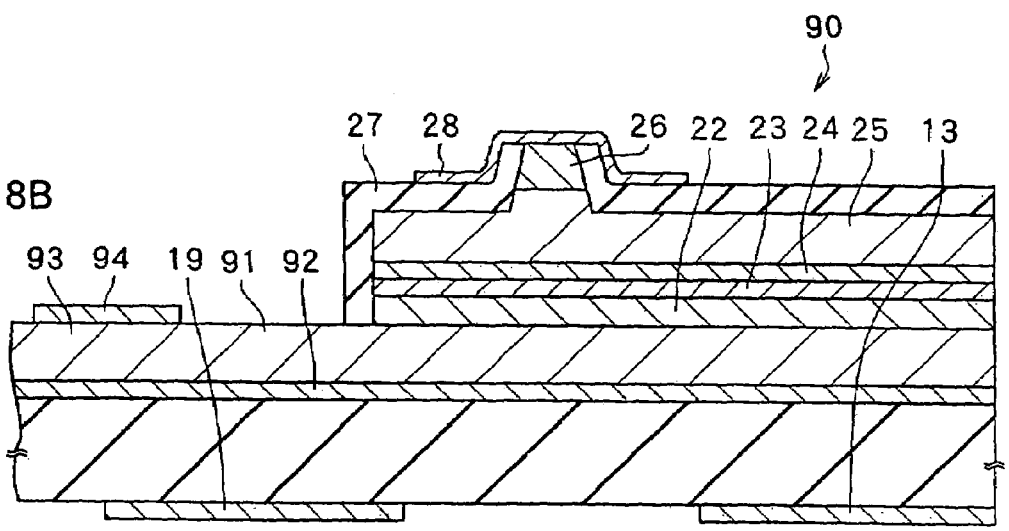

As shown in FIG. 18B, the p-side contact layer 26, p-type cladding layer 25, degradation preventing layer 24, active layer 23, and n-type cladding layer 22 are etched in order, to expose a part of the n-side contact layer 93. After that, a not-shown mask is formed and, by using the mask, the upper layer portion in the p-type cladding layer 25, and the p-side contact layer 26 are formed in a narrow strip shape by, for example, RIE.

The insulating layer 27 made of silicon dioxide is formed on the side faces of the layers of which part is selectively etched and on the surface of the p-type cladding layer 25 by, for example, vapor deposition. After that, the rear face side of the first substrate 91 is lapped and polished so that the thickness of the first substrate 91 becomes, for example, about 100 μm.

After thinning the first substrate 91, on the side of the first substrate 91 opposite to the buffer layer 92, the wiring layers 13 and 19 are formed in predetermined positions. In a manner similar to the first embodiment, the first substrate 91 is made of the material transparent in the visible region, so that the positions in which the wiring layers 13 and 19 are formed can be precisely controlled.

Subsequently, for instance, nickel, platinum, and gold are vapor-deposited in order on and around the surface of the p-side contact layer 26 to form the p-side electrode 28. For example, titanium and aluminum are vapor-deposited in order on the surface of the n-side contact layer 93 to thereby form the n-side electrode 94. Further, by conducting heat treatment, the p-side electrode 28 and the n-side electrode 94 are alloyed. After that, though not shown here, the first substrate 91 is, for example, cleaved in a predetermined width perpendicular to the longitudinal direction of the p-side electrode 28, and a pair of reflecting mirror films are formed on the cleaved faces. In such a manner, the first light emitting element 90 is fabricated.

After that, in a manner similar to the first embodiment, the second light emitting element 30 is fabricated.

The supporting base 17 on which wiring layers 17a and 17b are formed is prepared, the p-side electrode 28 in the first light emitting element 90 and the wiring layer 17a are attached to each other with the adhesive layer 12 in between, and the n-side electrode 94 and the wiring layer 17b are attached to each other with the adhesive layer 18 in between. The p-side electrode 46 in the second light emitting element 30 and the wiring layer 13 are attached to each other with the adhesive layer 15 in between, and the p-side electrode 57 and the wiring layer 19 are attached to each other with the adhesive layer 16 in between. In such a manner, the light emitting device 10C is completed.

In the light emitting device 10C according to the embodiment, the first substrate 91 is made of sapphire which is transparent in the visible region, so that the light emitting regions of the first and second light emitting elements 90 and 30 can be precisely controlled in a manner similar to the first embodiment.

Although the invention has been described above by the embodiments, the invention is not limited to the embodiments but can be variously modified. In the foregoing embodiments, the specific stacked structures of the first light emitting elements 20 and 90 and the second light emitting elements 30 and 60 have been described as examples. The invention is similarly applied to the case where the first light emitting elements 20 and 90 or second light emitting elements 30 and 60 have other structures. For example, the first light emitting element may have a construction to restrict a current by current block regions in a manner similar to the second light emitting elements 30 and 60. The second light emitting element may have a construction to narrow a current by an insulating film made of silicon dioxide or the like in a manner similar to the first light emitting elements 20 and 90. Although a ridge-guiding type semiconductor laser in which gain-guiding type and refractive index-guiding type are combined has been described as an example in the foregoing embodiments, the invention can be similarly applied to a gain-guiding type semiconductor laser and a refractive index-guiding type semiconductor laser.

Further, in the foregoing embodiments, the case where the layers made of GaN, AlGaAs, and AlGaInP compounds are formed by MOCVD has been described. The layers may be formed by other vapor phase epitaxy such as MBE or hydride vapor phase epitaxy. The hydride vapor phase epitaxy is vapor phase epitaxy in which halogen contributes to transport or reaction. Although the case where the layers made of ZnSe compounds are formed by MBE has been described in the second embodiment, the layers may be formed by other phase vapor epitaxy such as MOCVD.

In addition, although the specific examples regarding the materials of the first substrates 21 and 91 in the first light emitting elements 20 and 90 have been described, other materials may be also used. It is preferable to use a material which is transparent in the visible region, since effects described in the foregoing embodiments are obtained. More preferably, a material having high thermal conductivity is used. Examples of such materials are aluminum nitride and silicon carbide (SiC).

Further, in the third embodiment, the case where the second light emitting element 30 having the lasing portion 40 of the system AlGaAs and the lasing portion 50 of the system AlGaInP is provided has been described. Alternatively, the second light emitting element 60 described in the second embodiment may be provided.

Further, in the foregoing embodiments, the case where the first light emitting element 20 (90) and the second light emitting element 30 (60) emit light of different wavelengths has been described. A plurality of the first light emitting element 20 (90) can be stacked on one face of the supporting base 11 (17). Further, a plurality of light emitting elements of different characteristics or structures can be stacked. In this case, the wavelengths may be the same or different from each other. In the case of stacking a plurality of light emitting elements of different characteristics, for example, a low-output device and a high-output device can be mixedly used.

Although the case where the first light emitting element 20 (90) has one light emitting portion has been described in the foregoing embodiments, the first light emitting element 20 (90) may have a plurality of light emitting portions, specifically, a plurality of lasing portions in a manner similar to the second light emitting element 30. In this case, the wavelengths of the lasing portions may be the same or different from each other. The characteristics or structures may be the same or different from each other.

Further, in the embodiments, the case where the second light emitting element 30 (60) has two lasing portions has been described. The number of the lasing portions of the second light emitting element may be one or three or more. The wavelengths, characteristics, or structures of the lasing portions may be the same or different from each other.

Figure 1:
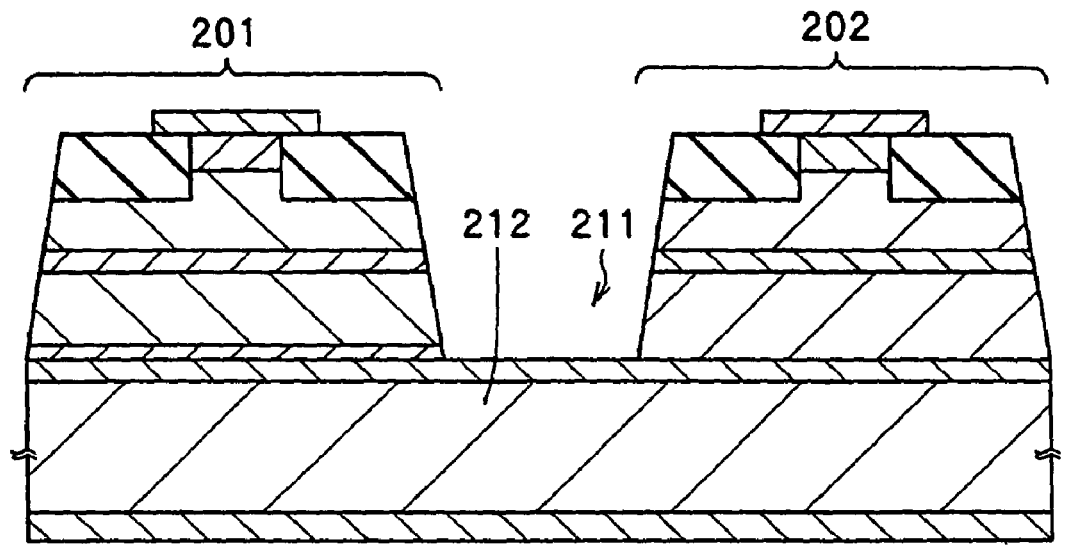
FIG. 1 is a cross section showing an example of the configuration of a related-art light emitting device.
Figure 2:
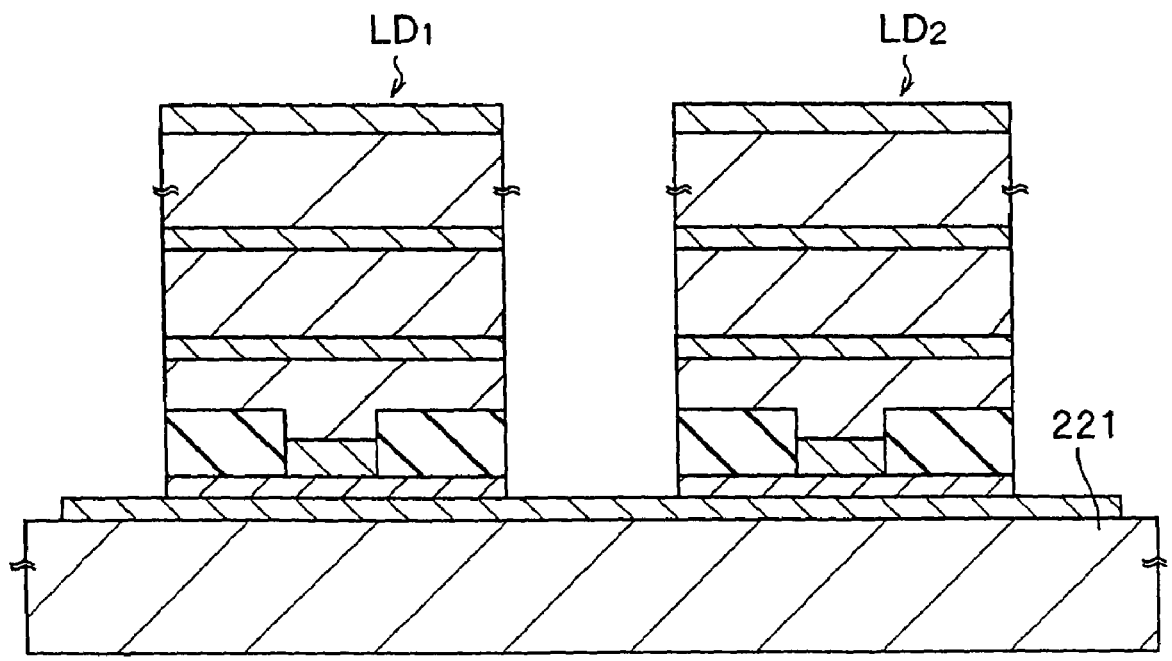
FIG. 2 is a cross section showing another example of the configuration of a related-art light emitting device.
Figure 3:
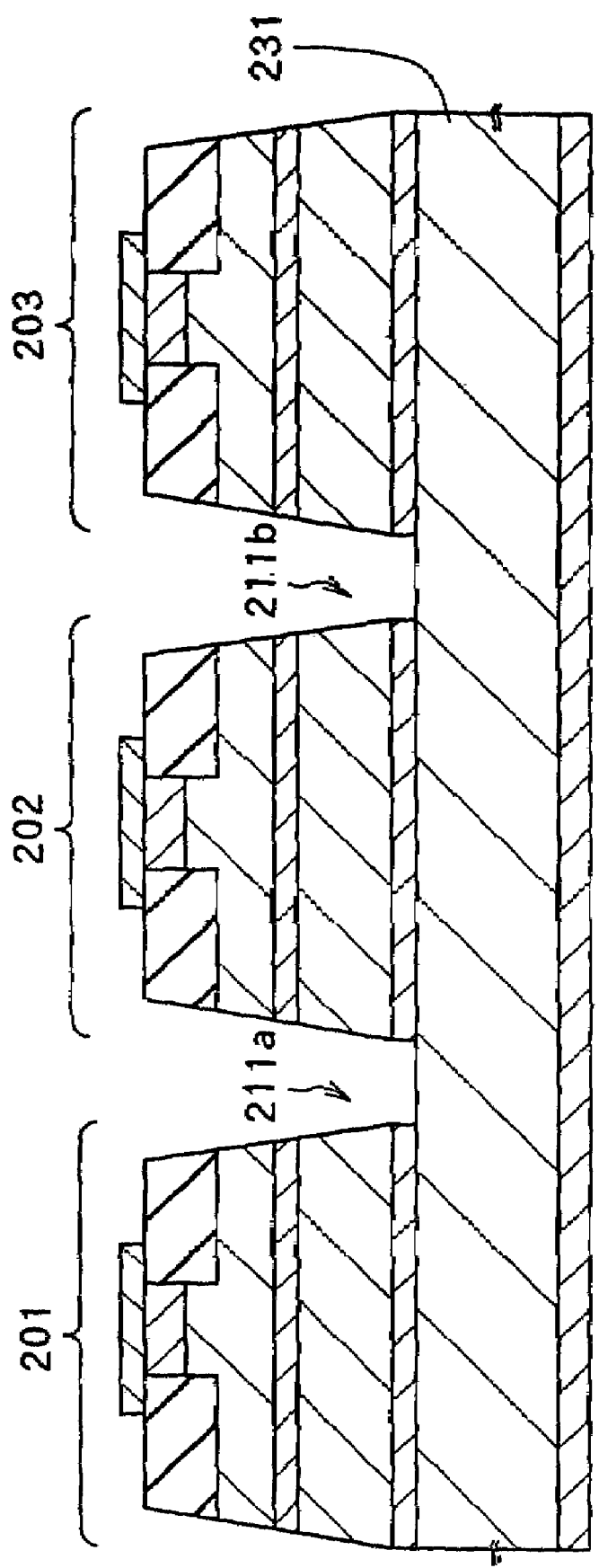
FIG. 3 is a cross section showing still another example of the configuration of a related-art light emitting device.

In addition, although the case where each of the second light emitting elements 30 and 60 is what is called a monolithic type multiple-wavelength laser has been described in the foregoing embodiments, the invention can be also applied to the case where the second light emitting element is what is called a hybrid type multiple-wavelength laser as shown in FIG. 2.

Further, although the specific examples regarding the materials of the supporting bases 11 and 17 have been described in the foregoing embodiments, other materials may be also used. However, a material having high thermal conductivity is preferable. Although the supporting base 11 is made of a metal in the first and second embodiments, in a manner similar to the third embodiment, the supporting base may be made of an insulating material and a wire may be provided on the supporting base.

In addition, although the supporting base 11 (17) is directly supported by the supporting body 2 at the time of housing the light emitting device in the package 1 in the foregoing embodiments, it is also possible to provide a placement stage for the supporting body 2 and place the supporting base 11 (17) on the placement stage.

Although a semiconductor laser has been described as a specific example of the light emitting element in the embodiments, the invention can be also applied to a light emitting device having other light emitting element such as a light emitting diode (LED).

According to the light emitting device of the invention, since the plurality of light emitting elements are stacked on one face of the supporting base, it is unnecessary to dispose a plurality of light emitting elements on the same substrate, and the device can be easily manufactured.

Especially, according to the light emitting device of one aspect of the invention, the first substrate is transparent in the visible region, so that the positions of the light emitting regions in the first and second light emitting elements can be precisely controlled.

Moreover, according to the light emitting device of one aspect of the invention, the first light emitting element has a semiconductor layer containing at least one of Group 3B elements and at least nitrogen (N) from Group 5B elements, so that the first light emitting element can emit light of a wavelength around 400 nm. Consequently, when the light emitting device is mounted on an optical device, an optical device having higher performance can be realized.

Further, according to the light emitting device of one aspect of the invention, the first substrate is made of either a Group III-V compound semiconductor of the nitride system containing at least one of Group 3B elements and at least nitrogen from Group 5B elements, or sapphire. Heat generated at the time of light emission in the second light emitting element can be therefore promptly dissipated via the first substrate. Thus, a temperature rise in the second light emitting element can be prevented and the device can operate stably for long time.

In addition, the optical device according to the invention is constructed by using the light emitting device of the invention. Consequently, higher performance can be achieved and reduction in size and cost can be realized.

Obviously many modifications and variations of the present invention are possible in the light of the above teachings. It is therefore to be understood that within the scope of the appended claims the invention may be practiced otherwise than as specifically described.

What is claimed is:

1. A light emitting device comprising:
a supporting base;
a first light emitting element having a first substrate, provided on one face of the supporting base; and
a second light emitting element having a second substrate, provided on the side of the first light emitting element opposite to the supporting base,
the supporting base is secured to the first light emitting element by means of a first adhesive layer,
wherein,
said first light emitting element and said second light emitting element are secured together by means of a second adhesive layer on electrodes of said first light emitting element and said second light emitting element,
the first adhesive layer material has a melting point higher than that of the second adhesive layer material.

2. A light emitting device according to claim 1, wherein the first substrate is transparent in the visible region.

3. A light emitting device according to claim 1, wherein the first and second light emitting elements can emit light of different wavelengths.

4. A light emitting device according to claim 1, wherein the first light emitting element has a semiconductor layer containing at least one of Group 3B elements and at least nitrogen (N) from Group 5B elements.

5. A light emitting device according to claim 4, wherein the first substrate is made of either a Group III-V compound semiconductor of the nitride system containing at least one of Group 3B elements and at least nitrogen (N) from Group 5B elements, or sapphire ($Al_2O_3$).

6. A light emitting device according to claim 1, wherein the first light emitting element has a light emitting portion on the first substrate on the side thereof on which the supporting base is disposed.

7. A light emitting device according to claim 1, wherein the second light emitting element has a light emitting portion on the second substrate on the side thereof on which the first light emitting element is disposed.

8. A light emitting device according to claim 1, wherein the second light emitting element has a plurality of light emitting portions of different output wavelengths.

9. A light emitting device according to claim 1, wherein the second substrate is made of gallium arsenide (GaAs).

10. A light emitting device according to claim 1, wherein the second light emitting element has a semiconductor layer containing at least gallium (Ga) from Group 3B elements and at least arsenide (As) from Group 5B elements.

11. A light emitting device according to claim 1, wherein the second light emitting element has a semiconductor layer containing at least indium (In) from Group 3B elements and phosphorus (P) from Group 5B elements.

12. A light emitting device according to claim 1, wherein the second light emitting element has a semiconductor layer containing at least one element selected from the group of Group 2A or 2B elements consisting of zinc (Zn), cadmium (Cd), mercury (Hg), beryllium (Be) and magnesium (Mg), and at least one element selected from the group of Group 6B elements consisting of sulfur (S), selenium (Se) and tellurium (Te).

* * * * *